US006485554B1

(12) United States Patent
Itsuki et al.

(10) Patent No.: US 6,485,554 B1
(45) Date of Patent: Nov. 26, 2002

(54) SOLUTION RAW MATERIAL FOR FORMING COMPOSITE OXIDE TYPE DIELECTRIC THIN FILM AND DIELECTRIC THIN FILM

(75) Inventors: Atsushi Itsuki, Saitama; Taiji Tachibana, Hyogo; Katsumi Ogi, Saitama, all of (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/184,510

(22) Filed: Nov. 2, 1998

(30) Foreign Application Priority Data

Oct. 31, 1997 (JP) ........ 9-300766
Feb. 9, 1998 (JP) ........ 10-027242
Mar. 13, 1998 (JP) ........ 10-063109
Aug. 24, 1998 (JP) ........ 10-237619

(51) Int. Cl.[7] ........ C23C 16/40; C09K 3/00; B05D 5/12

(52) U.S. Cl. ........ 106/287.18; 106/1.05; 148/284; 427/126.3; 427/585

(58) Field of Search ........ 148/277, 284; 264/681; 106/1.05, 1.11–1.29, 285, 287.1–287.26, 14.41–14.44; 428/639, 626; 427/126.3, 585, 124, 123, 126.1, 126.2, 126.4–126.6, 248.1, 250; 585/2, 3; 501/134, 137; 556/51, 54, 40

(56) References Cited

U.S. PATENT DOCUMENTS 4,268,539 A * 5/1981 Nakayama et al. ........ 427/108
4,830,672 A * 5/1989 Yamada et al. ........ 106/287.19
4,908,065 A * 3/1990 Tanitsu et al. ........ 106/287.24
5,122,510 A * 6/1992 Chen et al. ........ 505/1
5,372,850 A * 12/1994 Uchikawa et al. ........ 427/255.3
5,650,362 A * 7/1997 Nashimoto ........ 437/243
5,767,302 A * 6/1998 Ogi et al. ........ 556/54
5,820,664 A * 10/1998 Gardiner et al. ........ 106/287.17
5,916,359 A * 6/1999 Baum et al. ........ 106/287.18
5,980,983 A * 11/1999 Gordon ........ 427/226
6,101,085 A * 8/2000 Kawahara et al. ........ 361/312
6,126,996 A * 10/2000 Kirlin et al. ........ 427/252
6,174,564 B1 * 1/2001 Scott et al. ........ 427/126.3

FOREIGN PATENT DOCUMENTS

JP 9-111299 * 4/1997
WO WO 93/12266 6/1993

OTHER PUBLICATIONS

U.S. patent application Ser. No. 09/184,510, filed Nov. 2, 1998, pending.
U.S. patent application Ser. No. 09/289,638, filed Apr. 12, 1999, pending.

* cited by examiner

*Primary Examiner*—Deborah Jones
*Assistant Examiner*—Michael LaVilla
(74) *Attorney, Agent, or Firm*—Oblon, Spivak, McClelland, Maier & Neustadt, P.C.

(57) ABSTRACT

The present invention provides a solution suitable for forming a composite oxide type dielectric thin film containing at least one organometallic compound dissolved in at least one solvent selected from the group consisting of cyclic or acyclic diethers, alkyl-substituted cyclic monoethers, mono- or di-branched alkyl monoethers, alkoxy alcohols, diols, and acetoacetic esters, or dissolved in a solvent mixture comprising at least one solvent selected from the group consisting of cyclic and acyclic saturated hydrocarbons, and at least one solvent selected from the group consisting of cyclic or acyclic diethers, alkyl-substituted cyclic monoethers, mono- or di-branched alkyl monoethers, alkoxy alcohols, diols, acetoacetic esters, and unsubstituted or alkyl-substituted pyridine. These solutions can be used in a metal oxide chemical deposition method (a MOCVD method, a chemical vapor deposition method using an organometallic compound) to prepare composite oxide (for example, barium strontium titanate) type dielectric thin films on substrates.

12 Claims, 1 Drawing Sheet

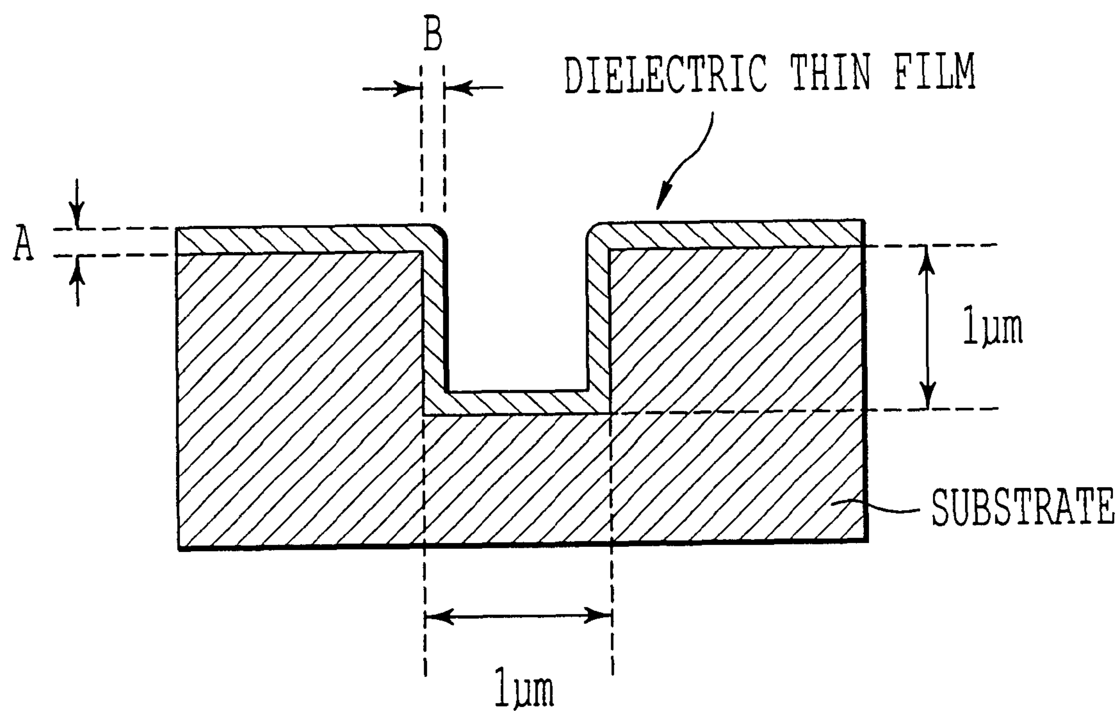
B
DIELECTRIC THIN FILM
A
1μm
SUBSTRATE
1μm

SOLUTION RAW MATERIAL FOR FORMING COMPOSITE OXIDE TYPE DIELECTRIC THIN FILM AND DIELECTRIC THIN FILM

BACKGROUND OF THE INVENTION

1. Field of the Invention

The present invention relates to a solution raw material containing at least two organometallic compounds for forming a composite oxide dielectric thin film used for a dielectric memory such as DRAM (Dynamic Random Access Memory), a dielectric filter, and the like, by a metal oxide chemical deposition method (a MOCVD method, a chemical vapor deposition method using an organometallic compound).

2. Description of the Background

As the degree of integration of DRAM increases, use of conventional $SiO_2$ for a dielectric thin film used as a capacitor becomes more difficult, and use of a composite oxide type (an oxide containing at least two metals) dielectric material having a high dielectric constant has been investigated. Examples of such dielectric materials include lead titanate (PT), lead titanate zirconate (PZT), lanthanum lead titanate zirconate (PLZT), strontium titanate (ST), barium titanate (BT), barium strontium titanate (BST), and the like. Particularly, BST is most excellent from the viewpoint of dielectric characteristics.

For thin films of such composite oxide type dielectric materials, a sol-gel method has been conventionally intensively studied in which a film is formed on a substrate by spin coating using metal alkoxides as raw materials. The sol-gel method is capable of easily controlling the film composition because no metal component is vaporized. However, a capacitor electrode of DRAM has a step, and the step increases and is complicated as the degree of integration increases. Therefore, it is difficult to uniformly form a dielectric thin film on the electrode as a substrate by the spin coating method.

Therefore, in recent few years, formation of a dielectric thin film by the MOCVD method with excellent step coverage (the property of adhesion to the surface of a complicated shape having a step) has been actively studied in expectation of higher integration of a device. As an organometallic compound as a raw material, an organometallic complex or a metal alkoxide containing β-diketone compound as a ligand, such as dipivaloylmethane (DPM) or the like, is generally used. Both an alkoxide and β-diketone complex are used as metal raw materials for Ti, Zr, Ta and the like, and β-diketone complexes are mainly used as raw materials for Sr and Ba.

The MOCVD method is a method comprising vaporizing a metal raw material by heating under reduced pressure, transporting the vapor to a deposition chamber, pyrolyzing the vapor on a substrate, and adhering the produced metal oxide to the substrate. In the case of the above composite oxide type thin film, at least two types of organometallic compounds must be used as raw materials. Therefore, control of the amount of the raw material compounds supplied to the deposition chamber, i.e., control of the film composition, is very important for the MOCVD method because compounds have different volatilities.

In formation of the dielectric thin film by the MOCVD method, conventionally, an organometallic compound as a raw material is vaporized by heating, and the generated vapor is transferred to the deposition chamber to form the film. However, an organometallic compound, particularly a DPM complex recommended for use in the MOCVD method, has low stability and volatility, and thus volatility deteriorates during use, or an increase in heating temperature for increasing volatility causes pyrolysis before the vapor of the raw material compound reaches the deposition chamber. Therefore, it is difficult to stably transport the raw material to the deposition chamber, thereby causing a problem in which the expensive raw material is disposed of at each time of film deposition. Also it is difficult to control the film composition, thereby causing a problem in which a thin film having good dielectric characteristics cannot be stably formed.

In order to solve these problems, Japanese Unexamined Patent Publication No. 6-158328 discloses that a solution raw material containing all organometallic compounds dissolved in tetrahydrofuran (THF) is used for the MOCVD method. This solution in a liquid state is supplied to a vaporization chamber arranged before the deposition chamber according to a method referred to as a liquid raw material supply method, and the vapor generated by vaporization in the vaporization chamber is sent to the deposition chamber to form the thin film. In a liquid state, particularly, the DPM complex is stable, and thus the raw material can be repeatedly used. Also, since the heating temperature for vaporization is decreased, it is possible to avoid pyrolysis before the raw material reaches the deposition chamber, and improve controllability of the film composition.

As a similar liquid raw material supply method, Japanese Unexamined Patent Publication No. 5-132776 discloses that a solution of a specified Ba complex (a complex in which two molecules of dipivaloylmethane and one molecule of ethylenediamine are coordinated with a Ba atom) dissolved in THF is used as a raw material. Japanese Unexamined Patent Publication No. 5-247650 discloses that a solution of a metal alkoxide in an organic solvent which boils at the same time as the metal alkoxide is used as a raw material for CVD. Examples of such solvents include alcohols such as ethanol, methanol, propanol, and the like; ethers such as ethyl ether, methyl ether, tetrahydrofuran, and the like; ketones such as methyl ethyl ketone, dimethyl ketone, acetone, and the like. Particularly, ethanol, tetrahydrofuran, and methanol are preferred.

Japanese Unexamined Patent Publication No. 7-321039 filed in 1994 discloses that a flash vapor method (the same as the liquid raw material supply method) comprising dissolving a solid compound as a raw material for CVD in an organic solvent, and sending a small amount of the solution to a vaporizer heated to simultaneously vaporize the solid compound and the organic solvent has been studied for a few years.

Also Japanese Unexamined Patent Publication No. 7503759 discloses that a raw material for CVD is dissolved in a solvent capable of doing co-flash evaporation and is then supplied. Examples of such a solvent include ethers, amines, and alkanols (alcohols). Specifically, isopropanol (IPA), and a solvent mixture of THF/IPA/tetraglyme at 8/2/1 are used.

However, as a result of study conducted by the inventors, it was found that even when a dielectric thin film is formed by the MOCVD method using a solution raw material containing an organometallic compound as a raw material dissolved in THF, composition control is very difficult, and a thin film having the intended composition cannot be easily obtained.

For example, it was found that a raw material such as titanium alkoxide (e.g., titanium tetraisopropoxide) as a Ti raw material, or bis(dipivaloylmethanato) barium complex [$Ba(DPM)_2$] as a Ba raw material tends to react with THF in THF at room temperature to form an nonvolatile reaction product, and the raw material present in the solution is partially vaporized, thereby significantly decreasing the amount of the raw material vaporized.

On the other hand, bis(dipivaloylmethanato) strontium complex [$Sr(DPM)_2$] as a Sr raw material is stable in THF at room temperature. However, since the complex is solvated by the polar solvent in THF, the complex is present in the form of [$Sr(DPM)_2L_1$] (wherein L is a solvent, i.e., THF, and n is an integer), and is vaporized in this form. However, in vaporization, the solid raw material [$Sr(DPM)_2$] and the liquid $L_n$ have greatly different evaporation temperatures, and thus $L_n$ is dissociated by heat in the course of evaporation to easily cause the phenomenon that the Sr raw material is not sent to the deposition chamber. Also THF is polymerizable, and thus produces ring opening polymerization by heating in evaporation, thereby making the complex unstable.

Therefore, the use of the THF solution makes unstable the supply of a raw material vapor to the deposition chamber, and has the large possibility of producing a composite oxide having a metal composition ratio completely different from the composition ratio of the metal raw materials in the solution. It is thus difficult to control the film composition, and it is still impossible to realize stable production of a dielectric thin film having a predetermined composition. The use of the above solvent mixture of THF/IPA/tetraglyme at 8/2/1 containing THF as a main component produces substantially the same results. A solution raw material containing alkanol such as IPA as a solvent also has difficulties in controlling the composition.

SUMMARY OF THE INVENTION

It is an object of the present invention to solve this problem. More specifically, it is an object of the present invention to provide a solution useful for producing a dielectric thin film by the MOCVD method having excellent controllability of film composition and permitting stable supply of the above organometallic compounds as raw materials to the deposition chamber without producing pyrolysis of the organometallic compounds as raw materials and nonvolatile products, thereby permitting the secure formation of a dielectric thin film having a predetermined composition.

The present inventors found that by using a polar solvent such as a cyclic or acyclic diether, alkyl-substituted cyclic monoether, mono- or di-substituted alkyl monoether, alkoxy alcohol, diol, or acetoacetic ester, or a solvent mixture of a non-polar solvent such as saturated hydrocarbon and one of these polar solvents in place of THF, making the Ti raw material and Ba raw material nonvolatile, and dissociation of the Sr raw material are eliminated or significantly decreased, thereby permitting stable supply of vapors of these raw materials to the deposition chamber. This resulted in achievement of the present invention.

The present invention therefore provides a solution raw material for forming a composite oxide type dielectric thin film by the MOCVD method, comprising a solution containing at least one organometallic compound as a raw material dissolved in at least one solvent selected from cyclic or acyclic diethers, alkyl-substituted monoethers, mono- or di-branched alkyl monoethers, alkoxy alcohols, diols, and acetoacetic esters.

In another embodiment, the present invention provides a solution raw material for forming a composite oxide type dielectric thin film by the MOCVD method, comprising a solution containing at least one organometallic compound as a raw material dissolved in a solvent mixture containing at least one solvent selected from cyclic and acyclic saturated hydrocarbons, and at least one solvent selected from cyclic or acyclic diethers, alkyl-substituted monoethers, mono- or di-branched alkyl monoethers, alkoxy alcohols, diols, acetoacetic esters, and unsubstituted or alkyl-substituted pyridine.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a drawing illustrating the method of measuring step coverage.

DETAILED DESCRIPTION OF THE INVENTION

By forming a dielectric thin film by the MOCVD method using a solution raw material containing organometallic compounds according to the present invention, the organometallic compound as each of raw materials can stably be supplied to the deposition chamber without causing pyrolysis and nonvolatile products. Therefore, even if the substrate temperature changes, the composite oxide type dielectric thin film having a composition ratio close to the metal composition ratio of the solution raw material used can stably be formed to a uniform thickness on the substrate having a step, and a dielectric thin film having good dielectric characteristics can stably be formed on an electrode of a DRAM capacitor having a step.

Examples of composite oxide type dielectric thin films which can be formed by using the solution raw material of the present invention include thin films of lead titanate (PT), lead titanate zirconate (PZT), lanthanum lead titanate zirconate (PLZT), strontium titanate (ST), barium titanate (BT), barium strontium titanate (BST), and the like, but other thin films can also be formed. Particularly, BST having excellent dielectric characteristics are preferred.

As the organometallic compound as the raw material for the thin film, organometallic compounds containing a metal selected from the constituent metals of the thin films, i.e., Pb, Ti, Zr, and alkali earth metals (e.g., Ca, Ba, Sr) are used. In some cases, alkali metals (e.g., Cs); various transition metals such as Mn, Nb, V, and the like; and rare earth metals such as La and the like are used. For the BST thin film, various organometallic compounds of Ti, Ba and Sr are used as raw materials.

As the organometallic compound as a raw material, a compound which is volatile, pyrolyzed by heating, and easily changed to an oxide by introducing an oxidizer (e.g., oxygen) is used. Such an organometallic compound generally has a structure in which a metal atom combines with an organic group through an oxygen atom. Preferred examples of such a compound include metal alkoxides, metal β-diketonato complexes, and metal alkoxide/β-diketonato complexes.

Examples of β-diketonato complexes include metal complexes containing as ligands β-diketones such as acetylacetone, hexafluoroacetylacetone, dipivaloylmethane, pentafluoropropanoylpivaloylmethane, and the like. Of these complexes, complexes with dipivaloylmethane (DPM)

are preferred. As metal alkoxides, alkoxides having an alkoxy group having 1 to 6 carbon atoms are preferred, and particularly alkoxides having a branched alkoxy group (e.g., isopropoxy, tert-butoxy, and the like) are preferred. More preferable organometallic compounds include metal dipivaloylmethanoto complexes, metal isopropoxides, metal tert-butoxides, metal isopropoxide/dipivaloylmethanato complexes, and metal tert-butoxide/dipivaloylmethanato complexes.

β-diketonato complexes (e.g., dipivaloylmethanato complexes) are preferably used for alkali earth metals, alkali metals, and Pb; both β-diketonato complexes and metal alkoxides can generally be used for transition metals such as Ti, Zr, V, Nb, and the like; metal alkoxide/dipivaloylmethanato complexes can also be used for transition metals.

As the raw material for deposition of the BST thin film, dipivaloylmethanato complexes of barium and strontium, and a titanium compound selected from isopropoxide, terbutoxide, dipivaloylmethanato complexes, isopropoxide/dipivaloylmethanato complexes, and tertbutoxide/dipivaloylmethanato complexes are preferably used.

In the present invention, at least two organometallic compounds (referred to as "raw material compounds" hereinafter) used as raw materials are respectively dissolved in organic solvents, or dissolved in the same organic solvent. In the use of at least three raw material compounds, some of the raw materials may be simultaneously dissolved, and the remaining solvents may be individually dissolved in a solvent.

When the raw material compounds are respectively dissolved in solvents, the solvents used may be the same, or all or some of the solvents may be different. When the raw material compounds are simultaneously dissolved in an organic solvent, the raw material compounds are preferably dissolved at substantially the same ratio as the composition ratio of the metals in the dielectric thin film deposited. This is because the solution raw material of the present invention enables the formation of a thin film comprising a composite metal oxide having substantially the same composition ratio as the metal composition ratio of the raw material compounds in the solution raw material. Namely, since the metal composition ratio of the solution raw material is substantially the same as the metal composition ratio of the thin film formed by the MOCVD method, the composition of the thin film can easily securely be controlled by the metal composition ratio of the solution.

As the organic solvent, at least one selected from the group consisting of cyclic and acyclic diethers, alkyl-substituted cyclic monoethers. mono- or di-branched alkyl monoethers, alkoxy alcohols, diols, and acetoacetic esters can be used.

All of these solvents are polar solvents, and coordinate with the organic metal complex by salvation. However, these solvents have the high electron donating ability, as compared with THF, and high dissolving power for the organometallic compounds, thereby stabilizing the complex coordinated with a solvent.

THF is polymerizable and produces ring opening polymerization by heat, thereby making the complex unstable. However, all of the above organic solvents used in the present invention do not polymerize or are less polymerizable than THF, and thus do not make the complex unstable due to polymerization. For the above-described reasons, the organometallic compounds as raw materials can be more stably supplied to the deposition chamber, as compared with THF.

Therefore, even when the organometallic compounds are dissolved in any one of the solvents used in the present invention, decomposition of the organometallic compounds as raw materials is suppressed before the deposition chamber, and the raw materials can stably be supplied to the deposition chamber while maintaining their chemical forms, thereby improving controllability of the film composition.

Preferred acyclic diethers (i.e., dialkoxyalkanes) include dimethoxy lower alkanes and diethoxy lower alkanes having 3 to 12 carbon atoms, more preferably 10 or less carbon atoms. Examples of such diethers include dimethoxymethane, 1,1-dimethoxyethane, 1,2-dimethoxyethane, 1,1-diethoxyethane, 1,2-diethoxyethane, 3,4-dimethoxy-2,2-dimethylbutane, 3,4-dimethoxy-2,2-diethylbutane, 2,3-dimethoxy-1,1-dimethylpropane, 2,3-dimethoxy-1,1-diethylpropane, 1,2-dimethoxyhexane, 1,2-diethoxyhexane, 1,2-dimethoxybutane, 1,2-diethoxybutane, 1,2-dimethoxypropane, 1,2-diethoxypropane, and the like. A preferable cyclic diether is dioxane.

For example, 1,1-dimethoxyethane and 1,2-dimethoxyethane have a boiling point close to that (66° C.) of THF, while 1,1-diethoxyethane and 1,2-diethoxyethane have a higher boiling point close to the vaporization temperature of solid raw materials (the organometallic compounds). Solvents having boiling points closer to those of the solid raw materials are more preferable.

Alkyl-substituted cyclic monoethers are preferably mono- or dimethyl-substituted tetrahydrofuran. Particularly, 2-methyltetrahydrofuran, 3-methyltetrahydrofuran, and 2,5-dimethyltetrahydrofuran are preferred as alkyl-substituted monoethers.

Mono- or di-branched alkyl monoethers preferably have 5 to 12 carbon atoms. Particularly, diisobutyl ether, diisopropyl ether, isobutyl lower alkyl ether, isopentyl lower alkyl ether are preferred. As the lower alkyl group, alkyl groups having 1 to 6 carbon atoms, such as methyl, ethyl, propyl, butyl, hexyl, and the like, are preferred.

Alkoxyl alcohols preferably have 3 to 12 carbon atoms, more preferably 8 carbon atoms or less. Examples of such alkoxy alcohols include 1-ethoxy-2-propanol, 1-butoxy-2-propanol, and the like.

Diols preferably have 2 to 4 carbon atoms, and propylene glycol is particularly preferred.

Acetoacetic esters are preferably lower alkyl esters of acetoacetic acid, and examples of such acetoacetic esters include methyl acetoacetate, and ethyl acetoacetate.

These solvents may be used singly or in combination of at least two solvents. Of the above solvents, alkyl-substituted cyclic monoethers such as 2-methyl tetrahydrofuran, 3-methyl tetrahydrofuran, and 2,5-dimethyl tetrahydrofuran are particularly preferred. The most preferred solvent is 2-methyl tetrahydrofuran.

In accordance with another embodiment of the present invention, a solution raw material is prepared by using a solvent mixture containing at least one cyclic or acyclic saturated hydrocarbon (alkane or cycloalkane) as a non-polar solvent, and at least one of the above polar solvents.

Since alkanes and cycloalkanes have low reactivity and high azeotropic vapor pressure, dissolution of Sr(DPM)2 causes no coordination of a solvent, and enables dissolution of this compound in its state. Therefore, it is possible to stably vaporize the solution without pyrolysis of the organometallic compounds before the deposition chamber. The use of a non-polar solvent (alkane or cylcoalkane) having such a function and a polar solvent sometimes further improves the controllability of the film composition.

Alkanes and cycloalkanes preferably have 5 to 8 carbon atoms, and alkanes may be straight chain or branched chain alkanes. Examples of such alkanes include n-pentane, n-hexane, n-heptane, n-octane, isopentane, isooctane, and the like. Particularly, n-hexane, n-octane and isooctane are preferred. Preferred examples of cycloalkanes include cyclohexane, cycloheptane, and cyclooctane.

In the use of the solvent mixture of a non-polar solvent and a polar solvent, besides the above solvents, unsubstituted and alkyl-substituted pyridine can be used as the polar solvent. When pyridine or alkyl-substituted pyridine is singly used as the solvent, the solvent vaporizes together with the organometallic compounds because of high coordination to the organometallic compounds, and is easily captured as carbon in the film, thereby causing the problem of deteriorating the controllability of the film composition. However, this problem is solved by using the mixture solvent with alkane as a non-polar solvent. Examples of alkyl-substituted pyridine include 2,5-lutidine and 2,6-lutidine.

In the case of the solvent mixture, the mixing ratio is not limited, but the mixture preferably contains 10 to 90 wt % of alkane or cycloalkane and 90 to 10 wt % of polar solvent, more preferably 30 to 70 wt % of the former and 70 to 30 wt % of the latter. A solvent other than the above solvents may be used in an amount of 50 wt % or less, preferably 30 wt % or less, more preferably 10 wt % or less, of the total of the solvents, but at least one of the above solvents is preferably used. In the present invention, a mixture solvent containing n-hexane and 1,2-diethoxyethane or 2,5- or 2,6-lutidine is particularly preferred.

At least two organometallic compounds containing the metal elements which constitute the dielectric thin film are simultaneously or separately dissolved in the above-described solvent to prepare the solution raw material used for forming the dielectric thin film by the MOCVD method. The dielectric thin film is formed on the substrate (or another base) by the MOCVD method using the solution raw material. The MOCVD method may be performed by any desired conventional known method.

Although the solution raw material of the present invention can be vaporized directly from a raw material container, a liquid raw material supply method (i.e., a method comprising supplying the solution to the vaporization chamber heated, instantaneously vaporizing the solution raw material in the chamber, and sending the vapor to the deposition chamber) is preferable. The liquid raw material can be supplied to the vaporization chamber, for example, by forcing using a carrier gas comprising inert gas such as nitrogen, helium, argon, or the like. The amount of the liquid raw material supplied to the vaporization chamber may be controlled by an appropriate liquid flow controller provided at an intermediate position.

When all the raw material compounds are dissolved in the solvent, the compounding ratio of the organometallic compounds as raw materials is set to a value so that the film formed by the MOCVD method has a composition comprising a predetermined composite oxide. This ratio varies with the types of the compounds used, deposition conditions, etc., and may be determined by experiment. In the present invention, since the raw material compounds in a solution state have stable volatility, and the metal atomic ratio of the formed thin film is substantially the same as the metal atomic ratio of the solution, the composite oxide type dielectric thin film having the predetermined composition can stably be formed, thereby obtaining stable film quality. Although the concentration of the solution is not limited, the molar concentration is preferably in the range of 0.01 to 1M, more preferably 0.05 to 0.5 M, in terms of composite oxide. These concentration ranges include all specific values and subranges therebetween, including 0.01, 0.1, 0.2, 0.3, 0.4, 0.6, 0.7, 0.8 and 0.9 M.

When at least one raw material compound is individually dissolved, at least two solution raw materials are obtained. In supply of these solutions to the vaporization chamber by the liquid raw material supply method, each of the solutions is first supplied to a mixing chamber arranged in front of the vaporization chamber to mix the solutions, and the mixed solution is then supplied in a liquid state to the vaporization chamber by a pump. By providing the mixing chamber, the film composition can easily be controlled. Namely, the concentration of each of the solutions and the supply of the solution raw material by forcing can be controlled so that the metal composition ratio of the solvent mixture in the mixing chamber is substantially the same as the predetermined metal composition ratio of the thin film. This control is easy to perform, and has reproducibility.

Preferred deposition conditions include a substrate temperature of 400 to 650° C., more preferably 420 to 500° C., a deposition pressure of 5 to 20 Torr, more preferably 10 to 15 Torr, and a solution raw material supply of 0.05 to 0.5 cc/min, more preferably 0.05 to 0.1 cc/min. The solution is preferably vaporized at a temperature of 350° C. or less by using the carrier gas. The vaporization temperature is more preferably 150 to 300° C. As the carrier gas, an inert gas such as helium, argon, or the like is preferably used. The flow rate of the carrier gas is preferably in the range of 300 to 500 ccm. To the deposition chamber is supplied oxygen gas or oxygen-containing gas as a reaction gas. In the use of oxygen gas, the supply is preferably in the range of 1000 to 2000 ccm. The deposition time may be determined to form the dielectric thin film having a predetermined thickness, but the deposition time is generally about 10 to 60 minutes. These conditions may be changed to conditions other than the above.

The dielectric thin film formed by the MOCVD method using the solution raw material of the present invention is useful for a capacitor of DRAM. Although the MOCVD method is generally excellent in step coverage, the use of the solution raw material of the present invention further improves the step coverage, as compared with the use of a conventional THF solution. It is thought that the use of THF deteriorates adhesion to a step (recess) because the complex becomes unstable due to the polymerizability of THF.

In the present invention, the step coverage is defined as the ratio (b/a) of the thickness b of a film in a recess to the thickness a of a film on the surface of a substrate when a thin film was formed on a $Pt/Ti/SiO_2$ substrate having a 1-$\mu$m cubic (i.e., 1 $\mu$m long and wide and 1 $\mu$m deep) recess provided therein as shown in FIG. 1. As the ratio is closer to 1, the step coverage becomes better. The b/a ratio is ideally 1, and the thickness of the thin film is suitably about 15 to 30 nm.

By using the solution raw material of the present invention, the dielectric thin film having excellent step coverage, i.e., a b/a value of 0.9 to 1.1, can be formed by the MOCVD method. Generally, since the vapor hardly enters the recess, the thickness b of the film in the recess is liable to be smaller than the thickness a of the film formed on the surface of the substrate. Therefore, the b/a value hardly exceeds 1, and thus the b/a value of the dielectric thin film formed from the solution raw material of the present invention is generally in the range of 0.9 to 1.0. However, in the use of THF, the b/a value is generally 0.5 or less, frequently 0.3 or less (for example, 0.01 to 0.20), and rarely, at most, about 0.85, and a ratio of over 0.9 exhibiting excellent coverage cannot be obtained. Therefore, the solution raw material of the present invention is expected to permit the formation of the dielectric thin film having a uniform thickness to completely coat the surface of a substrate having unevenness even if the step of a capacitor electrode as the substrate further increases in future due to higher integration of DRAM.

As described above, the solution raw material of the present invention enables stable supply of the vapor of each of raw material compounds to the deposition chamber, and thus the controllability of the film composition is excellent. It is thus possible to stably form the dielectric thin film having a desired composition and dielectric characteristics on the substrate. The dielectric thin film formed from the solution raw material of the present invention can also be used as a dielectric filter for a piezoelectric resonator and an infrared sensor.

Having generally described this invention, a further understanding can be obtained by reference to certain specific examples which are provided herein for purposes of illustration only and are not intended to be limiting unless otherwise specified.

EXAMPLES

In the examples below, a BST (barium strontium titanate) thin film was formed by the MOCVD method from a solution raw material prepared by using each of various solvents. The raw materials used for deposition included DPM (dipivaloylmethane) complexes of metals [i.e., $Ba(DPM)_2$ and $Sr(DPM)_2$] or triethylene glycol-added complexes [$Ba(DPM)_2$.TEG and $Sr(DPM)_2$.TEG] as Ba and Sr raw materials, and any one of alkoxides, alkoxide/DPM complexes and DPM complexes as a Ti raw material, as described in each of the examples.

Example 1

As organometallic compounds as raw materials, $Ba(DPM)_2$, $Sr(DPM)_2$ and $Ti(O\text{-}i\text{-}Pr)_2(DPM)_2$ were individually dissolved in 1,2-dimethoxyethane to prepare three types of solution raw materials at a concentration of 0.1 to 0.2 M. By using these solution raw materials, a BST thin film was formed on a DRAM substrate by the liquid raw material supply method. Specifically, the three types of solution raw materials were sent to the mixing chamber and mixed therein at the flow rate controlled so that the molar ratio of $Ba(DPM)_2$, $SR(DPM)_2$ and $Ti(O\text{-}i\text{-}Pr)_2(DPM)_2$ was 1:1:2, and the mixed solution was then vaporized in the vaporization chamber. The vapor was transferred into the deposition chamber to form the BST thin film on the surface of the substrate having a recess of 1 $\mu$m long and wide, and 1 $\mu$m deep under the conditions below. The deposition time was adjusted to deposit the BST thin film having a thickness of about 20 nm.

Deposition Conditions

| | |
|---|---|
| Substrate | $Pt/Ti/SiO_2$ |
| Substrate temperature | 400 to 650° C. |
| Deposition pressure | 10 Torr |
| Solution raw material supply | 0.05 cc/min |
| Raw material concentration | 0.1 to 0.2M |
| Reaction gas | $O_2$ gas, 1000 ccm |
| Vaporization temperature of each raw material | 200 to 250° C. |
| Carrier gas | He 500 ccm |

The deposition experiment was carried out while changing the substrate temperature, and the metal atomic ratio of each of the thin films formed on the substrate was determined by fluorescent X-ray analysis. The results are processed by a computer, and shown as atomic ratios (indicated as Ba/Sr) of Ba and Sr to two Ti atoms in Table 1.

Namely, this atomic ratio corresponds to the ratio x/y when the film composition is represented by $Ba_xSr_yTi_2O_6$. Since the supplies of the solution raw materials are determined so that the atomic ratio of Ba:Sr:Ti is 1:1:2, the atomic ratio of the formed BST thin film should be the same as this atomic ratio. Therefore, the ratio Ba/Sr is ideally 1/1.

For example, at a Ba/Sr ratio of 0.1/0.5, the atomic ratio Ba:Sr:Ti=0.2:0.5:2. This means that the relative amount of Ti vaporized is largest, and the amount of Ba vaporized is smallest. At a Ba/Sr ratio of 1.0/1.2., the atomic ratio Ba:Sr:Ti=1.0:1.2:2, which means that the amount of Sr vaporized is slightly larger than those of the other atoms. At a Ba/Sr ratio of <0.1/<0.1, this means that both Ba and Sr are hardly vaporized, for example, due to reaction of the raw material compounds with other component or the solvent. Both atomic ratios of Ba and Sr is preferably in the range of 0.8 to 1.2, i.e., Ba/Sr is preferably in the range of 1.2/0.8 to 0.8/1.2.

On the other hand, in a SEM photograph of a section of the substrate, the thickness of the dielectric thin film was measured at a plurality points in the periphery of the 1-$\mu$m cubic recess (the substrate surface) of the substrate and in the recess, and measurements were averaged to determine the thickness d in the periphery of the recess and the thickness 12 in the recess. The ratio b/a was determined as step coverage.

The deposition experiment was repeated two times for each of the substrate temperatures, and the measurement results obtained are shown in Table 1 together with the substrate temperatures.

Table 1 indicates that even if the substrate temperature is changed, the BST thin film having a metal atomic ratio close to the metal molar ratio of the solution raw materials supplied (i.e., the atomic ratios of both Ba and Sr are in the range of 0.8 to 1.2) can be formed. It was thus verified that the controllability of the film composition is excellent. At all temperatures, the values of step coverage were 0.9 or more and close to 1, and the step coverage was also excellent.

For comparison, BST type composite oxide thin films were formed by the same method as described above except that the solvent was changed to THF. In this case, as shown in Table 1, the formed thin films have a composition in which the ratios of Ba and Ti are significantly lower than that of Sr, and the film composition greatly irregularly varies with the substrate temperature. It was thus found that the controllability of the film composition is significantly inferior to the solution raw materials of the present invention. The value (i.e., the b/a ratio) of step coverage was also as low as 0.01 to 0.31 (i.e., the thickness of the film in the recess is only 0.01 to 0.31 time of the thickness of the film on the substrate plane), and step coverage was significantly inferior to the example.

TABLE 1

| Test No. | Solution raw material for MOCVD: Organometallic compound | Solvent | Substrate temperature (° C.) | Film composition Ba/Sr atomic ratio | Step coverage |
|---|---|---|---|---|---|
| 1 | $Ba(DPM)_2$ | 1,2-di- | 400 | 1.0/1.1 | 0.90 |
| 2 | + | methoxy | 450 | 1.1/0.9 | 0.91 |
| 3 | $Sr(DPM)_2$ | ethane | 500 | 1.0/1.1 | 0.95 |
| 4 | + | (Example) | 550 | 1.1/1.0 | 0.91 |
| 5 | Ti(O-i- | | 600 | 0.8/1.0 | 0.92 |
| 6 | $Pr)_2(DPM)_2$ | | 650 | 1.0/1.1 | 0.90 |
| 7 | | | 400 | 1.0/1.1 | 0.91 |
| 8 | | | 450 | 1.0/1.0 | 0.95 |
| 9 | | | 500 | 1.1/1.0 | 0.92 |
| 10 | | | 550 | 1.0/1.1 | 0.94 |
| 11 | | | 600 | 0.9/1.1 | 1.0 |
| 12 | | | 650 | 1.0/1.0 | 1.0 |
| 13 | | THF | 400 | <0.1/<0.1 | 0.31 |
| 14 | | (Comp. | 450 | <0.1/<0.1 | 0.20 |
| 15 | | Example) | 500 | 0.1/<0.1 | 0.10 |
| 16 | | | 550 | 0.3/<0.1 | 0.15 |
| 17 | | | 600 | 0.3/0.1 | 0.13 |
| 18 | | | 650 | 0.3/<0.1 | 0.11 |
| 19 | | | 400 | <0.1/0.1 | 0.10 |
| 20 | | | 450 | <0.1/0.1 | 0.09 |
| 21 | | | 500 | 0.5/<0.1 | 0.05 |
| 22 | | | 550 | 0.8/0.1 | 0.06 |
| 23 | | | 600 | 0.8/<0.1 | 0.01 |
| 24 | | | 650 | 0.5/<0.1 | 0.01 |

Example 2

BST thin films (a thickness of about 20 nm) were formed on substrates by the MOCVD method in the same manner as Example 1 except that the Ti raw material was changed to $TiO(DPM)_2$. For comparison, thin films were deposited by the same method except that THF was used as a solvent.

The results of measurement of the metal atomic ratio and the step coverage of each of the formed thin films were shown in Table 2 together with the substrate temperatures. This table indicates that in the present invention, since the film composition hardly changes with changes in the substrate temperature, dielectric thin films having a substantially constant composition can be formed, and the controllability of the film composition is thus excellent. On the other hand, in comparative examples using the THF solution, thin films having the intended composition cannot be deposited, and the film composition irregularly significantly changes with changes in the substrate temperature, thereby causing difficulties in controlling the film composition. With respect to the step coverage, in the examples, the b/a values are 0.9 or more and close to 1, while in the comparative examples, the b/a values are as small as 0.30 or less.

TABLE 2

| Test No. | Solution raw material for MOCVD: Organometallic compound | Solvent | Substrate temperature (° C.) | Film composition Ba/Sr atomic ratio | Step coverage |
|---|---|---|---|---|---|
| 1 | $Ba(DPM)_2$ | 1,2-di- | 400 | 1.0/0.9 | 0.90 |
| 2 | + | methoxy | 450 | 1.1/1.1 | 0.91 |
| 3 | $Sr(DPM)_2$ | ethane | 500 | 1.0/1.0 | 0.93 |
| 4 | + | (Example) | 550 | 1.2/1.2 | 0.90 |
| 5 | $TiO(DPM)_2$ | | 600 | 1.1/1.0 | 0.92 |
| 6 | | | 650 | 1.0/1.1 | 0.95 |
| 7 | | | 400 | 1.1/1.1 | 0.98 |
| 8 | | | 450 | 1.0/1.0 | 0.91 |
| 9 | | | 500 | 1.0/1.1 | 0.92 |
| 10 | | | 550 | 0.8/0.9 | 0.95 |
| 11 | | | 600 | 1.0/1.0 | 0.94 |
| 12 | | | 650 | 0.9/1.0 | 0.98 |
| 13 | | THF | 400 | <0.1/<0.1 | 0.30 |
| 14 | | (Comp. | 450 | <0.1/0.1 | 0.20 |
| 15 | | Example) | 500 | 0.1/0.3 | 0.18 |
| 16 | | | 550 | 0.5/<0.1 | 0.15 |
| 17 | | | 600 | 0.1/<0.1 | 0.18 |
| 18 | | | 650 | 0.21<0.1 | 0.20 |
| 19 | | | 400 | <0.1/0.1 | 0.19 |
| 20 | | | 450 | 0.1/0 | 0.11 |
| 21 | | | 500 | 0.5/<0.1 | 0.05 |
| 22 | | | 550 | 0.8/<0.1 | 0.05 |
| 23 | | | 600 | 0.8/<0.1 | 0.04 |
| 24 | | | 650 | 0.5/<0.1 | 0.07 |

Example 3

BST thin films (a thickness of about 20 nm) were formed on substrates by the MOCVD method in the same manner; as Example 1 except that the Ti raw material was changed to $Ti(O\text{-}i\text{-}Pr)_4$. For comparison, thin films were deposited by the same method except that THF was used as a solvent.

The results of measurement of the metal atomic ratio of each of the formed thin films were shown in Table 3 together with the substrate temperatures. This table indicates that in the present invention, since the film composition hardly changes with changes in the substrate temperature, dielectric thin films having a substantially constant composition can be formed, and the controllability of the film composition is thus excellent. On the other hand, in comparative examples using the THF solution, thin films having the intended composition cannot be deposited, and the film composition irregularly significantly changes with changes in the substrate temperature, thereby causing difficulties in controlling the film composition.

TABLE 3

| Test No. | Solution raw material for MOCVD: Organometallic compound | Solvent | Substrate temperature (° C.) | Film composition Ba/Sr atomic ratio |
|---|---|---|---|---|
| 1 | $Ba(DPM)_2$ | 1,2-di- | 400 | 1.0/1.1 |
| 2 | + | methoxy- | 450 | 0.9/1.0 |
| 3 | $Sr(DPM)_2$ | ethane | 500 | 1.1/1.1 |
| 4 | + | (Example) | 550 | 1.1/1.0 |
| 5 | $Ti(O\text{-}i\text{-}Pr)_4$ | | 600 | 1.0/1.0 |
| 6 | | | 650 | 1.2/1.1 |
| 7 | | | 400 | 1.0/1.0 |
| 8 | | | 450 | 0.8/1.0 |
| 9 | | | 500 | 1.1/1.2 |
| 10 | | | 550 | 1.0/1.1 |
| 11 | | | 600 | 1.1/1.0 |
| 12 | | | 650 | 1.0/1.0 |
| 13 | | THF | 400 | <0.1/0.1 |
| 14 | | (Comp. | 450 | <0.1/0.1 |

TABLE 3-continued

| Test No. | Solution raw material for MOCVD: Organometallic compound | Solvent | Substrate temperature (° C.) | Film composition Ba/Sr atomic ratio |
|---|---|---|---|---|
| 15 | | Example) | 500 | 0.1/0.2 |
| 16 | | | 550 | 0.3/0.1 |
| 17 | | | 600 | 0.3/0.1 |
| 18 | | | 650 | 0.3/0.1 |
| 19 | | | 400 | <0.1/0.1 |
| 20 | | | 450 | <0.1/0.1 |
| 21 | | | 500 | 0.5/0.1 |
| 22 | | | 550 | 0.8/0.1 |
| 23 | | | 600 | 0.8/0.1 |
| 24 | | | 650 | 0.5/0.2 |

Example 4

BST thin films (a thickness of about 20 nm) was formed on substrates by the MOCVD method in the same manner as Example 1 except that the Ti raw material was changed to $Ti(O\text{-}t\text{-}Bu)_2(DPM)_2$. For comparison, thin films were deposited by the same method except that THF was used as a solvent.

The results of measurement of the metal atomic ratio and the step coverage of each of the formed thin films were shown in Table 4 together with the substrate temperatures. This table indicates that in the present invention, since the film composition hardly changes with changes in the substrate temperatures, dielectric thin films having a substantially constant composition can be formed, and the controllability of the film composition is thus excellent. On the other hand, in comparative examples using the THF solution, thin films having the intended composition cannot be deposited, and the film composition irregularly significantly changes with changes in the substrate temperature, thereby causing difficulties in controlling the film composition. With respect to the step coverage, in the examples, the b/a values are as excellent as 0.9 or more and close to 1, while in the comparative examples using the THF solvent, the b/a values are in the range of 0.10 to 0.35 which are slightly larger than Examples 1 and 2, but are still low values.

TABLE 4

| Test No. | Solution raw material for MOCVD: Organometallic compound | Solvent | Substrate temperature (° C.) | Film composition Ba/Sr atomic ratio | Step coverage |
|---|---|---|---|---|---|
| 1 | $Ba(DPM)_2$ | 1,2-di- | 400 | 1.1/1.1 | 0.90 |
| 2 | + | methoxy | 450 | 1.0/1.1 | 0.95 |
| 3 | $Sr(DPM)_2$ | ethane | 500 | 1.2/1.0 | 0.91 |
| 4 | + | (Example) | 550 | 1.0/1.2 | 0.95 |
| 5 | Ti(O-t- | | 600 | 1.0/1.0 | 0.93 |
| 6 | $Bu)_2(DPM)_2$ | | 650 | 1.2/1.1 | 0.91 |
| 7 | | | 400 | 1.0/1.1 | 0.90 |
| 8 | | | 450 | 1.0/1.0 | 0.90 |
| 9 | | | 500 | 1.1/1.0 | 0.91 |
| 10 | | | 550 | 1.2/1.1 | 0.95 |
| 11 | | | 600 | 1.0/1.0 | 0.97 |
| 12 | | | 650 | 0.9/1.0 | 0.98 |
| 13 | | THF | 400 | <0.1/<0.1 | 0.35 |
| 14 | | (Comp. | 450 | <0.1/<0.1 | 0.20 |
| 15 | | Example) | 500 | <0.1/<0.1 | 0.30 |
| 16 | | | 550 | 0.2/<0.1 | 0.20 |

TABLE 4-continued

| Test No. | Solution raw material for MOCVD: Organometallic compound | Solvent | Substrate temperature (° C.) | Film composition Ba/Sr atomic ratio | Step coverage |
|---|---|---|---|---|---|
| 17 | | | 600 | 0.1/<0.1 | 0.10 |
| 18 | | | 650 | 0.2/<0.1 | 0.10 |
| 19 | | | 400 | <0.1/0.1 | 0.30 |
| 20 | | | 450 | <0.1/<0.1 | 0.30 |
| 21 | | | 500 | 0.5/<0.1 | 0.25 |
| 22 | | | 550 | 0.8/<0.1 | 0.10 |
| 23 | | | 600 | 0.1/<0.1 | 0.15 |
| 24 | | | 650 | 0.2/<0.1 | 0.10 |

Example 5

BST thin films (a thickness of about 20 nm) were formed on substrates by the MOCVD method in the same manner as Examples 1 to 4 except that the solvent was changed to 1,1-dimethoxyethane. The results of measurement of the metal atomic ratio of each of the formed thin films were shown in Table 5 together with the substrate temperatures. Although, in many of the examples below, the results of only one measurement at each of the temperatures are shown, the results of the second measurement were substantially the same as that of the first measurement. Table 5 indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 5

Example 5: Solvent = 1,1-dimethoxyethane

| Test No. | Organometallic compound[1] | Substrate temperature (° C.) | Film composition Ba/Sr atomic ratio |
|---|---|---|---|
| 1 | A | 400 | 1.0/1.1 |
| 2 | | 450 | 1.0/1.0 |
| 3 | | 500 | 1.1/1.2 |
| 4 | | 550 | 1.0/1.0 |
| 5 | | 600 | 1.1/1.1 |
| 6 | | 650 | 1.0/1.0 |
| 7 | B | 400 | 1.0/1.1 |
| 8 | | 450 | 1.0/1.0 |
| 9 | | 500 | 1.0/1.1 |
| 10 | | 550 | 1.0/1.0 |
| 11 | | 600 | 1.0/1.0 |
| 12 | | 650 | 1.1/1.0 |
| 13 | C | 400 | 1.1/1.1 |
| 14 | | 450 | 1.0/1.0 |
| 15 | | 500 | 1.1/1.2 |
| 16 | | 550 | 1.0/1.1 |
| 17 | | 600 | 1.0/0.9 |
| 18 | | 650 | 1.1/1.0 |
| 19 | D | 400 | 1.0/1.1 |
| 20 | | 450 | 0.8/1.0 |
| 21 | | 500 | 1.1/0.9 |
| 22 | | 550 | 1.0/0.9 |
| 23 | | 600 | 1.1/1.0 |
| 24 | | 650 | 1.0/1.0 |

[1]Organometallic compound:

TABLE 5-continued

Example 5: Solvent = 1,1-dimethoxyethane

| Test No. | Organometallic compound[1] | Substrate temperature (° C.) | Film composition Ba/Sr atomic ratio |
|---|---|---|---|

A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 6

BST thin films (a thickness of about 20 nm) were formed on substrates by the MOCVD method in the same manner as Examples 1 to 4. except that the solvent was changed to 1,2-diethoxyethane. The results of measurement of the metal atomic ratio of each of the formed thin films were shown in Table 6 together with the substrate temperatures. Table 6 indicates that since the film composition hardly changes with changes in the substrate temperatures, dielectric thin films having a substantially constant composition can be formed, and the controllability of the film composition is thus excellent. In this example, the results in comparative examples in which the solvent was changed to THF are as shown in Tables 1 to 4.

TABLE 6

Example 6: Solvent = 1,2-diethoxyethane

| Test No. | Organometallic compound[1] | Substrate temperature (° C.) | Film composition Ba/Sr atomic ratio |
|---|---|---|---|
| 1 | A | 400 | 1.0/1.1 |
| 2 | | 450 | 1.0/1.0 |
| 3 | | 500 | 1.1/1.1 |
| 4 | | 550 | 1.0/0.9 |
| 5 | | 600 | 1.1/1.1 |
| 6 | | 650 | 1.0/1.0 |
| 7 | B | 400 | 0.9/0.8 |
| 8 | | 450 | 1.0/1.0 |
| 9 | | 500 | 1.0/1.1 |
| 10 | | 550 | 0.9/1.0 |
| 11 | | 600 | 1.0/1.0 |
| 12 | | 650 | 1.1/1.1 |
| 13 | C | 400 | 1.0/1.1 |
| 14 | | 450 | 0.8/1.0 |
| 15 | | 500 | 1.1/1.0 |
| 16 | | 550 | 1.0/1.0 |
| 17 | | 600 | 0.9/1.1 |
| 18 | | 650 | 1.1/1.0 |
| 19 | D | 400 | 0.9/1.0 |
| 20 | | 450 | 1.1/1.0 |
| 21 | | 500 | 1.0/1.1 |
| 22 | | 550 | 1.1/0.9 |
| 23 | | 600 | 1.0/1.1 |
| 24 | | 650 | 1.0/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 7

BST thin films (a thickness of about 20 nm) were formed on substrates by the MOCVD method in the same manner as Example 4 except that the solvent was changed to dimethoxymethane. The results of measurement of the metal atomic ratio of each of the formed thin films were shown in Table 7 together with the substrate temperatures. This table indicates that since the film composition hardly changes with changes in the substrate temperatures, dielectric thin films having a substantially constant composition can be formed, and the controllability of the film composition is thus excellent. In this example, the results in comparative examples in which the solvent was changed to THF are as shown in Table 4.

TABLE 7

| Test No. | Solution raw material for MOCVD: Organometallic compound | Solution raw material for MOCVD: Solvent | Substrate temperature (° C.) | Film composition Ba/Sr atomic ratio |
|---|---|---|---|---|
| 1 | $Ba(DPM)_2$ | Dimethoxy- | 400 | 1.0/0.9 |
| 2 | + | methane | 450 | 1.0/1.0 |
| 3 | $Sr(DPM)_2$ | (Example) | 500 | 1.1/1.1 |
| 4 | + | | 550 | 1.0/1.0 |
| 5 | Ti(O-t- | | 600 | 1.1/1.0 |
| 6 | $Bu)_2(DPM)_2$ | | 650 | 1.0/1.0 |

Example 8

BST thin films (a thickness of about 20 nm) were formed on substrates by the MOCVD method in the same manner as Example 4 except that the solvent was changed to 1,2-dimethoxypropane or dimethoxymethane, and the Ba and Sr raw material compounds were changed to $Ba(DPM)_2$.TEG and $Sr(DPM)_2$.TEG, respectively. The results of measurement of the metal atomic ratio and the step coverage of each of the formed thin films were shown in Table 8 together with the substrate temperatures.

This table indicates that since the film composition hardly changes with changes in the substrate temperatures, dielectric thin films having a substantially constant composition can be formed, and the controllability of the film composition is thus excellent. The step coverage is also good. In this example, the results of the film compositions in comparative examples in which the solvent was changed to THF are also shown in Table 8.

TABLE 8

| Test No. | Solution raw material for MOCVD: Organometallic compound | Solution raw material for MOCVD: Solvent | Substrate temperature (° C.) | Film composition Ba/Sr atomic ratio | Step coverage |
|---|---|---|---|---|---|
| 1 | $Ba(DPM)_2$.TEG | 1,2-di- | 400 | 0.8/1.1 | 0.90 |
| 2 | + | methoxy | 450 | 1.0/1.1 | 0.91 |
| 3 | $Sr(DPM)_2$.TEG | propane | 500 | 1.0/1.1 | 0.90 |
| 4 | + | (Example) | 550 | 1.1/1.0 | 0.92 |
| 5 | $Ti(O\text{-}t\text{-}Bu)_2$ | | 600 | 1.0/1.0 | 0.91 |
| 6 | $(DPM)_2$ | | 650 | 1.0/1.1 | 0.95 |
| 7 | | Di- | 400 | 1.1/1.1 | 0.90 |
| 8 | | methoxy | 450 | 1.1/1.0 | 0.91 |
| 9 | | methane | 500 | 1.0/1.1 | 0.92 |
| 10 | | (Example) | 550 | 0.9/1.0 | 0.90 |
| 11 | | | 600 | 1.0/1.1 | 0.90 |
| 12 | | | 650 | 1.0/1.0 | 0.91 |
| 13 | | THF | 400 | 1.8/0.1 | — |

TABLE 8-continued

| Test No. | Solution raw material for MOCVD: Organometallic compound | Solvent | Substrate temperature (° C.) | Film composition Ba/Sr atomic ratio | Step coverage |
|---|---|---|---|---|---|
| 14 | | (Comp. | 450 | 1.0/<0.1 | — |
| 15 | | Example) | 500 | 0.7/<0.1 | — |
| 16 | | | 550 | 0.8/<0.1 | — |
| 17 | | | 600 | 0.9/<0.1 | — |
| 18 | | | 650 | 0.6/0.1 | — |

Example 9

BST thin films (a thickness of about 20 nm) were formed on substrates by the MOCVD method in the same manner as Examples 1 to 4 except that the solvent was changed to a solvent mixture of n-hexane and 1,2-dimethoxyethane (a weight ratio of 1:1). The results of measurement of the metal atomic ratio of each of the formed thin films were shown in Table 9 together with the substrate temperatures. This table indicates that since the film composition hardly changes with changes in the substrate temperatures, dielectric thin films having a substantially constant composition can be formed, and the controllability of the film composition is thus excellent. In this example, the results in comparative examples in which the solvent was changed to THF are as shown in Tables 1 to 4.

TABLE 9

Example 9: Solvent = n-hexane + 1,2-dimethoxyethane (1:1)

| Test No. | Organometallic compound[1] | Substrate temperature (° C.) | Film composition Ba/Sr atomic ratio |
|---|---|---|---|
| 1 | A | 400 | 1.0/1.1 |
| 2 | | 450 | 0.9/1.0 |
| 3 | | 500 | 1.1/1.1 |
| 4 | | 550 | 1.0/0.9 |
| 5 | | 600 | 1.0/1.1 |
| 6 | | 650 | 1.0/1.0 |
| 7 | B | 400 | 0.8/1.0 |
| 8 | | 450 | 1.0/1.0 |
| 9 | | 500 | 1.1/1.0 |
| 10 | | 550 | 1.1/1.0 |
| 11 | | 600 | 1.0/1.1 |
| 12 | | 650 | 1.0/1.1 |
| 13 | C | 400 | 1.1/1.1 |
| 14 | | 450 | 1.0/1.1 |
| 15 | | 500 | 1.0/1.0 |
| 16 | | 550 | 1.1/1.0 |
| 17 | | 600 | 1.1/1.0 |
| 18 | | 650 | 1.0/1.1 |
| 19 | D | 400 | 1.0/1.0 |
| 20 | | 450 | 1.1/1.1 |
| 21 | | 500 | 1.2/1.1 |
| 22 | | 550 | 1.0/1.0 |
| 23 | | 600 | 1.0/1.1 |
| 24 | | 650 | 1.0/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$ Example 10

BST thin films (a thickness of about 20 nm) were formed on substrates by the MOCVD method in the same manner as Examples 1 to 4 except that the solvent was changed to a solvent mixture of n-hexane and 1,2-diethoxyethane (a weight ratio of 1:1). The results of measurement of the metal atomic ratio of each of the formed thin films were shown in Table 10 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 10

Example 10: Solvent = n-hexane + 1,2-diethoxyethane (1:1)

| Test No. | Organometallic compound[1] | Substrate temperature (° C.) | Film composition Ba/Sr atomic ratio |
|---|---|---|---|
| 1 | A | 400 | 0.9/1.1 |
| 2 | | 450 | 1.0/1.0 |
| 3 | | 500 | 1.0/1.1 |
| 4 | | 550 | 1.0/1.0 |
| 5 | | 600 | 1.1/1.1 |
| 6 | | 650 | 0.9/1.0 |
| 7 | B | 400 | 0.8/1.1 |
| 8 | | 450 | 1.0/1.0 |
| 9 | | 500 | 1.1/1.1 |
| 10 | | 550 | 1.1/1.2 |
| 11 | | 600 | 1.0/1.0 |
| 12 | | 650 | 0.9/1.1 |
| 13 | C | 400 | 1.0/0.9 |
| 14 | | 450 | 1.0/1.0 |
| 15 | | 500 | 0.9/1.1 |
| 16 | | 550 | 1.0/1.1 |
| 17 | | 600 | 1.1/1.0 |
| 18 | | 650 | 1.0/1.0 |
| 19 | D | 400 | 1.0/1.1 |
| 20 | | 450 | 0.8/1.0 |
| 21 | | 500 | 1.0/1.1 |
| 22 | | 550 | 1.1/1.0 |
| 23 | | 600 | 1.0/1.1 |
| 24 | | 650 | 1.0/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$ Example 11

BST thin films (a thickness of about 20 nm) were formed on substrates by the MOCVD method in the same manner as Examples 1 to 4 except that the solvent was changed to a solvent mixture of n-hexane and 2,5-lutidine (a weight ratio of 1:1). The results of measurement of the metal atomic ratio and the step coverage of each of the formed thin-films were shown in Table 11 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results in comparative examples in which the solvent was changed to THF are as shown in Tables 1 to 4.

TABLE 11

| Example 11: Solvent = n-hexane + 2,5-lutidine (1:1) | | | | |
|---|---|---|---|---|
| Test No. | Organometallic compound[1] | Substrate temperature (° C.) | Film composition Ba/Sr atomic ratio | Step coverage |
| 1 | A | 400 | 1.1/1.1 | 0.90 |
| 2 | | 450 | 1.0/1.1 | 0.90 |
| 3 | | 500 | 1.2/1.1 | 0.91 |
| 4 | | 550 | 1.1/1.0 | 0.92 |
| 5 | | 600 | 1.0/1.0 | 0.90 |
| 6 | | 650 | 1.0/1.1 | 0.95 |
| 7 | B | 400 | 0.9/1.0 | 0.91 |
| 8 | | 450 | 1.0/1.0 | 0.92 |
| 9 | | 500 | 1.0/1.1 | 0.90 |
| 10 | | 550 | 1.0/1.1 | 0.91 |
| 11 | | 600 | 1.0/1.0 | 0.95 |
| 12 | | 650 | 1.0/1.1 | 0.94 |
| 13 | C | 400 | 1.1/1.0 | 0.91 |
| 14 | | 450 | 1.0/1.0 | 0.91 |
| 15 | | 500 | 1.1/1.0 | 0.92 |
| 16 | | 550 | 1.1/1.1 | 0.91 |
| 17 | | 600 | 1.0/1.1 | 0.92 |
| 18 | | 650 | 1.0/1.0 | 0.91 |
| 19 | D | 400 | 0.9/1.1 | 0.91 |
| 20 | | 450 | 1.0/1.0 | 0.92 |
| 21 | | 500 | 1.1/1.0 | 0.91 |
| 22 | | 550 | 1.1/1.0 | 0.91 |
| 23 | | 600 | 0.9/1.0 | 0.95 |
| 24 | | 650 | 1.0/1.1 | 0.94 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 12

BST thin films (a thickness of about 20 nm) were formed on substrates by the MOCVD method in the same manner as Examples 1 to 4 except that the solvent was changed to a solvent mixture of n-hexane and 2,6-lutidine (a weight ratio of 1:1). The results of measurement of the metal atomic ratio of each of the formed thin films were shown in Table 12 together with the substrate temperatures. This table indicates that since the film composition hardly changes with changes in the substrate temperatures, dielectric thin films having a substantially constant composition can be formed, and the controllability of the film composition is thus excellent. In this example, the results in comparative examples in which the solvent was changed to THF are as shown in Tables 1 to 4.

TABLE 12

| Example 12: Solvent = n-hexane + 2,6-lutidine (1:1) | | | |
|---|---|---|---|
| Test No. | Organometallic compound[1] | Substrate temperature (° C.) | Film composition Ba/Sr atomic ratio |
| 1 | A | 400 | 0.9/1.0 |
| 2 | | 450 | 1.0/1.1 |
| 3 | | 500 | 1.1/1.1 |
| 4 | | 550 | 1.0/1.0 |
| 5 | | 600 | 1.0/1.0 |
| 6 | | 650 | 1.1/1.1 |
| 7 | B | 400 | 1.0/1.1 |
| 8 | | 450 | 1.0/1.0 |
| 9 | | 500 | 0.9/1.1 |
| 10 | | 550 | 1.0/1.1 |
| 11 | | 600 | 1.0/1.0 |
| 12 | | 650 | 0.9/1.0 |
| 13 | C | 400 | 1.1/1.0 |
| 14 | | 450 | 1.0/1.0 |
| 15 | | 500 | 1.1/1.1 |
| 16 | | 550 | 1.0/1.0 |
| 17 | | 600 | 1.0/1.1 |
| 18 | | 650 | 1.1/1.0 |
| 19 | D | 400 | 1.1/1.1 |
| 20 | | 450 | 0.9/1.1 |
| 21 | | 500 | 1.1/1.0 |
| 22 | | 550 | 1.0/1.0 |
| 23 | | 600 | 1.0/1.0 |
| 24 | | 650 | 1.0/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 13

BST thin films (a thickness of about 20 nm) were formed on substrates by the MOCVD method in the same manner as Examples 1 to 4 except that the solvent was changed to 3,4-dimethoxy-2,2-dimethylbutane. The results of measurement of the metal atomic ratio of each of the formed thin films were shown in Table 13 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 13

| Example 13: Solvent = 3,4-dimethoxy-2,2-dimethylbutane | | | |
|---|---|---|---|
| Test No. | Organometallic compound[1] | Substrate temperature (° C.) | Film composition Ba/Sr atomic ratio |
| 1 | A | 400 | 0.9/1.1 |
| 2 | | 450 | 1.1/1.2 |
| 3 | | 500 | 1.0/1.1 |
| 4 | | 550 | 1.0/1.1 |
| 5 | | 600 | 1.0/1.0 |
| 6 | | 650 | 1.1/1.1 |
| 7 | B | 400 | 1.0/1.1 |
| 8 | | 450 | 1.0/0.9 |
| 9 | | 500 | 0.9/1.1 |
| 10 | | 550 | 1.0/1.2 |
| 11 | | 600 | 1.0/1.0 |
| 12 | | 650 | 1.0/1.1 |
| 13 | C | 400 | 1.0/1.0 |
| 14 | | 450 | 1.0/1.0 |
| 15 | | 500 | 1.1/1.0 |
| 16 | | 550 | 0.9/1.1 |
| 17 | | 600 | 1.0/1.1 |
| 18 | | 650 | 1.1/1.0 |

TABLE 13-continued

Example 13: Solvent = 3,4-dimethoxy-2,2-dimethylbutane

| Test No. | Organometallic compound[1] | Substrate temperature (° C.) | Film composition Ba/Sr atomic ratio |
|---|---|---|---|
| 19 | D | 400 | 1.1/1.1 |
| 20 | | 450 | 1.0/0.9 |
| 21 | | 500 | 1.1/1.1 |
| 22 | | 550 | 1.1/1.0 |
| 23 | | 600 | 1.0/1.0 |
| 24 | | 650 | 1.0/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 14

BST thin films (a thickness of about 20 nm) were formed on substrates by the MOCVD method in the same manner as Examples 1 to 4. except that the solvent was changed to 3,4-diethoxy-2,2-dimethylbutane. The results of measurement of the metal atomic ratio of each of the formed thin films were shown in Table 14 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 14

Example 14: Solvent = 3,4-diethoxy-2,2-dimethylbutane

| Test No. | Organometallic compound[1] | Substrate temperature (° C.) | Film composition Ba/Sr atomic ratio |
|---|---|---|---|
| 1 | A | 400 | 0.9/1.1 |
| 2 | | 450 | 1.1/1.0 |
| 3 | | 500 | 1.0/1.0 |
| 4 | | 550 | 0.9/1.1 |
| 5 | | 600 | 1.0/1.1 |
| 6 | | 650 | 1.0/1.0 |
| 7 | B | 400 | 1.0/1.1 |
| 8 | | 450 | 1.0/1.0 |
| 9 | | 500 | 1.1/0.9 |
| 10 | | 550 | 1.0/1.0 |
| 11 | | 600 | 1.0/1.0 |
| 12 | | 650 | 1.0/1.1 |
| 13 | C | 400 | 1.1/1.1 |
| 14 | | 450 | 1.0/1.0 |
| 15 | | 500 | 1.1/1.0 |
| 16 | | 550 | 1.0/1.1 |
| 17 | | 600 | 1.0/1.1 |
| 18 | | 650 | 1.0/1.0 |
| 19 | D | 400 | 1.1/1.1 |
| 20 | | 450 | 1.0/1.0 |
| 21 | | 500 | 1.1/1.1 |
| 22 | | 550 | 1.0/0.9 |
| 23 | | 600 | 1.0/1.0 |
| 24 | | 650 | 1.1/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 15

BST thin films (a thickness of about 20 nm) were formed on substrates by the MOCVD method in the same manner as Examples 1 to 4 except that the solvent was changed to 2,3-dimethoxy-1,1-dimethylbutane. The results of measurement of the metal atomic ratio of each of the formed thin films were shown in Table 15 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 15

Example 15: Solvent = 2,3-dimethoxy-1,1-dimethylbutane

| Test No. | Organometallic compound[1] | Substrate temperature (° C.) | Film composition Ba/Sr atomic ratio |
|---|---|---|---|
| 1 | A | 400 | 1.0/1.1 |
| 2 | | 450 | 1.1/1.2 |
| 3 | | 500 | 1.1/1.1 |
| 4 | | 550 | 1.0/1.0 |
| 5 | | 600 | 1.0/1.0 |
| 6 | | 650 | 1.1/1.1 |
| 7 | B | 400 | 1.0/1.1 |
| 8 | | 450 | 1.0/1.0 |
| 9 | | 500 | 0.9/1.1 |
| 10 | | 550 | 1.0/1.1 |
| 11 | | 600 | 1.0/1.0 |
| 12 | | 650 | 0.9/1.1 |
| 13 | C | 400 | 1.1/1.0 |
| 14 | | 450 | 1.0/1.0 |
| 15 | | 500 | 1.2/1.1 |
| 16 | | 550 | 1.0/1.1 |
| 17 | | 600 | 1.0/1.1 |
| 18 | | 650 | 1.1/1.0 |
| 19 | D | 400 | 1.0/1.1 |
| 20 | | 450 | 0.8/1.0 |
| 21 | | 500 | 1.0/1.1 |
| 22 | | 550 | 1.0/0.9 |
| 23 | | 600 | 1.0/1.0 |
| 24 | | 650 | 0.9/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 16

BST thin films (a thickness of about 20 nm) were formed on substrates by the MOCVD method in the same manner as Examples 1 to 4 except that the solvent was changed to 2,3-diethoxy-1,1-dimethylbutane. The results of measurement of the metal atomic ratio of each of the formed thin films were shown in Table 16 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 16

Example 16: Solvent = 2,3-diethoxy-1,1-dimethylbutane

| Test No. | Organometallic compound[1] | Substrate temperature (° C.) | Film composition Ba/Sr atomic ratio |
|---|---|---|---|
| 1 | A | 400 | 1.1/1.0 |
| 2 | | 450 | 1.0/0.9 |
| 3 | | 500 | 1.0/1.1 |
| 4 | | 550 | 1.0/1.0 |
| 5 | | 600 | 1.0/1.0 |
| 6 | | 650 | 1.1/1.1 |
| 7 | B | 400 | 1.1/1.1 |
| 8 | | 450 | 1.0/1.0 |
| 9 | | 500 | 1.0/1.1 |
| 10 | | 550 | 1.1/1.0 |
| 11 | | 600 | 1.0/1.0 |
| 12 | | 650 | 1.1/1.1 |
| 13 | C | 400 | 1.0/1.0 |
| 14 | | 450 | 1.0/1.0 |
| 15 | | 500 | 1.1/1.0 |
| 16 | | 550 | 1.0/1.1 |
| 17 | | 600 | 1.1/1.1 |
| 18 | | 650 | 1.1/1.0 |
| 19 | D | 400 | 1.0/1.1 |
| 20 | | 450 | 0.9/1.1 |
| 21 | | 500 | 1.1/1.0 |
| 22 | | 550 | 1.0/1.1 |
| 23 | | 600 | 1.0/1.0 |
| 24 | | 650 | 0.9/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 17

BST thin films (a thickness of about 20 nm) were formed on substrates by the MOCVD method in the same manner as Examples 1 to 4 except that the solvent was changed to 1,2-dimethoxyhexane. The results of measurement of the metal atomic ratio of each of the formed thin films were shown in Table 17 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 17

Example 17: Solvent = 1,2-dimethoxyhexane

| Test No. | Organometallic compound[1] | Substrate temperature (° C.) | Film composition Ba/Sr atomic ratio |
|---|---|---|---|
| 1 | A | 400 | 0.8/1.1 |
| 2 | | 450 | 1.1/1.0 |
| 3 | | 500 | 1.0/1.1 |
| 4 | | 550 | 1.1/1.2 |
| 5 | | 600 | 1.0/1.0 |
| 6 | | 650 | 0.9/1.1 |
| 7 | B | 400 | 1.0/1.1 |
| 8 | | 450 | 1.0/1.0 |
| 9 | | 500 | 0.9/0.9 |
| 10 | | 550 | 1.1/1.0 |
| 11 | | 600 | 1.0/1.0 |
| 12 | | 650 | 0.9/1.1 |
| 13 | C | 400 | 1.0/0.9 |
| 14 | | 450 | 1.0/1.0 |
| 15 | | 500 | 1.1/1.1 |
| 16 | | 550 | 0.9/1.1 |
| 17 | | 600 | 1.0/1.1 |
| 18 | | 650 | 0.9/1.0 |
| 19 | D | 400 | 1.0/0.9 |
| 20 | | 450 | 0.9/1.0 |
| 21 | | 500 | 1.0/1.1 |
| 22 | | 550 | 1.0/0.9 |
| 23 | | 600 | 1.0/1.0 |
| 24 | | 650 | 1.0/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 18

BST thin films (a thickness of about 20 nm) were formed on substrates by the MOCVD method in the same manner as Examples 1 to 4 except that the solvent was changed to 1,2-diethoxyhexane. The results of measurement of the metal atomic ratio of each of the formed thin films were shown in Table 18 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 18

Example 18: Solvent = 1,2-diethoxyhexane

| Test No. | Organometallic compound[1] | Substrate temperature (° C.) | Film composition Ba/Sr atomic ratio |
|---|---|---|---|
| 1 | A | 400 | 0.9/0.9 |
| 2 | | 450 | 1.0/1.0 |
| 3 | | 500 | 1.0/1.0 |
| 4 | | 550 | 1.0/1.1 |
| 5 | | 600 | 0.9/1.1 |
| 6 | | 650 | 1.1/1.0 |
| 7 | B | 400 | 1.1/1.1 |
| 8 | | 450 | 0.8/1.1 |
| 9 | | 500 | 0.9/1.1 |
| 10 | | 550 | 1.0/1.0 |
| 11 | | 600 | 1.0/1.0 |
| 12 | | 650 | 1.1/1.1 |
| 13 | C | 400 | 1.1/1.0 |

TABLE 18-continued

Example 18: Solvent = 1,2-diethoxyhexane

| Test No. | Organometallic compound[1] | Substrate temperature (° C.) | Film composition Ba/Sr atomic ratio |
|---|---|---|---|
| 14 | | 450 | 1.0/1.0 |
| 15 | | 500 | 1.1/1.0 |
| 16 | | 550 | 1.0/1.1 |
| 17 | | 600 | 1.0/1.0 |
| 18 | | 650 | 1.1/1.0 |
| 19 | D | 400 | 0.9/0.9 |
| 20 | | 450 | 0.9/1.0 |
| 21 | | 500 | 1.0/1.1 |
| 22 | | 550 | 1.0/1.0 |
| 23 | | 600 | 1.0/1.0 |
| 24 | | 650 | 1.1/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 19

BST thin films (a thickness of about 20 nm) were formed on substrates by the MOCVD method in the same manner as Examples 1 to 4 except that the solvent was changed to 1,2-dimethoxypropane. The results of measurement of the metal atomic ratio of each of the formed thin films were shown in Table 19 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 19

Example 19: Solvent = 1,2-dimethoxypropane

| Test No. | Organometallic compound[1] | Substrate temperature (° C.) | Film composition Ba/Sr atomic ratio |
|---|---|---|---|
| 1 | A | 400 | 0.9/0.9 |
| 2 | | 450 | 1.0/0.9 |
| 3 | | 500 | 1.0/1.1 |
| 4 | | 550 | 1.0/0.9 |
| 5 | | 600 | 1.0/1.0 |
| 6 | | 650 | 1.0/1.1 |
| 7 | B | 400 | 1.0/1.1 |
| 8 | | 450 | 1.2/1.1 |
| 9 | | 500 | 1.1/1.0 |
| 10 | | 550 | 1.0/1.0 |
| 11 | | 600 | 1.1/1.0 |
| 12 | | 650 | 1.0/1.1 |
| 13 | C | 400 | 1.1/1.0 |
| 14 | | 450 | 1.0/1.0 |
| 15 | | 500 | 1.1/1.0 |
| 16 | | 550 | 0.9/1.1 |
| 17 | | 600 | 1.0/1.1 |
| 18 | | 650 | 1.1/1.0 |
| 19 | D | 400 | 1.1/1.1 |
| 20 | | 450 | 1.0/1.0 |
| 21 | | 500 | 1.1/1.1 |
| 22 | | 550 | 1.0/0.9 |

TABLE 19-continued

Example 19: Solvent = 1,2-dimethoxypropane

| Test No. | Organometallic compound[1] | Substrate temperature (° C.) | Film composition Ba/Sr atomic ratio |
|---|---|---|---|
| 23 | | 600 | 1.1/1.0 |
| 24 | | 650 | 1.1/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 20

BST thin films (a thickness of about 20 nm) were formed on substrates by the MOCVD method in the same manner as Examples 1 to 4 except that the solvent was changed to 1,2-diethoxypropane. The results of measurement of the metal atomic ratio of each of the formed thin films were shown in Table 20 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 20

Example 20: Solvent = 1,2-diethoxypropane

| Test No. | Organometallic compound[1] | Substrate temperature (° C.) | Film composition Ba/Sr atomic ratio |
|---|---|---|---|
| 1 | A | 400 | 1.0/1.1 |
| 2 | | 450 | 1.0/1.0 |
| 3 | | 500 | 1.1/1.1 |
| 4 | | 550 | 1.0/1.1 |
| 5 | | 600 | 1.0/1.1 |
| 6 | | 650 | 1.1/1.0 |
| 7 | B | 400 | 1.0/1.1 |
| 8 | | 450 | 0.9/1.0 |
| 9 | | 500 | 1.0/1.0 |
| 10 | | 550 | 1.0/1.1 |
| 11 | | 600 | 1.1/1.0 |
| 12 | | 650 | 0.9/1.0 |
| 13 | C | 400 | 1.1/1.0 |
| 14 | | 450 | 1.0/1.0 |
| 15 | | 500 | 1.1/1.0 |
| 16 | | 550 | 1.1/1.1 |
| 17 | | 600 | 1.0/1.1 |
| 18 | | 650 | 1.1/1.0 |
| 19 | D | 400 | 1.1/1.0 |
| 20 | | 450 | 0.8/1.0 |
| 21 | | 500 | 1.0/1.1 |
| 22 | | 550 | 1.1/1.0 |
| 23 | | 600 | 1.0/1.0 |
| 24 | | 650 | 1.1/1.1 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 21

BST thin films (thickness of about 20 nm) were formed on substrates by the MOCVD method in the same manner as Examples 1 to 4 except that the solvent was changed to 1,2-dimethoxybutane. The results of measurement of the metal atomic ratio of each of the formed thin films were shown in Table 21 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 21

Example 21: Solvent = 1,2-dimethoxybutane

| Test No. | Organo-metallic compound[1] | Substrate temperature (° C.) | Film composition Ba/Sr atomic ratio |
|---|---|---|---|
| 1 | A | 400 | 0.9/1.1 |
| 2 | | 450 | 1.0/0.9 |
| 3 | | 500 | 1.0/1.1 |
| 4 | | 550 | 1.0/1.1 |
| 5 | | 600 | 1.0/1.0 |
| 6 | | 650 | 1.1/1.1 |
| 7 | B | 400 | 1.0/1.1 |
| 8 | | 450 | 1.0/1.0 |
| 9 | | 500 | 0.9/0.9 |
| 10 | | 550 | 1.1/1.0 |
| 11 | | 600 | 1.1/1.0 |
| 12 | | 650 | 0.9/1.1 |
| 13 | C | 400 | 1.0/1.1 |
| 14 | | 450 | 0.9/1.0 |
| 15 | | 500 | 1.0/0.9 |
| 16 | | 550 | 1.0/1.0 |
| 17 | | 600 | 0.8/1.0 |
| 18 | | 650 | 1.0/0.9 |
| 19 | D | 400 | 1.1/1.1 |
| 20 | | 450 | 1.0/1.0 |
| 21 | | 500 | 1.0/0.9 |
| 22 | | 550 | 1.0/1.1 |
| 23 | | 600 | 1.0/1.0 |
| 24 | | 650 | 1.1/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 22

BST thin films (a thickness of about 20 nm) were formed on substrates by the MOCVD method in the same manner as Examples 1 to 4 except that the solvent was changed to 1,2-diethoxybutane. The results of measurement of the metal atomic ratio of each of the formed thin films were shown in Table 22 together with the substrate temperatures. This table indicates that since the film composition hardly changes with changes In the substrate temperature, dielectric thin film having a substantially constant composition can be formed, and the controllability of the film composition is thus excellent. In this example, the results in comparative examples in which the solvent was changed to THF are as shown in Tables 1 to 4.

TABLE 22

Example 22: Solvent = 1,2-diethoxybutane

| Test No. | Organo-metallic compound[1] | Substrate temperature (° C.) | Film composition Ba/Sr atomic ratio |
|---|---|---|---|
| 1 | A | 400 | 1.0/1.0 |
| 2 | | 450 | 1.0/1.0 |
| 3 | | 500 | 1.1/1.0 |
| 4 | | 550 | 1.0/1.1 |
| 5 | | 600 | 1.0/1.0 |
| 6 | | 650 | 1.1/1.1 |
| 7 | B | 400 | 0.8/1.1 |
| 8 | | 450 | 1.1/1.0 |
| 9 | | 500 | 0.9/1.1 |
| 10 | | 550 | 1.0/1.1 |
| 11 | | 600 | 1.0/1.0 |
| 12 | | 650 | 0.9/1.0 |
| 13 | C | 400 | 1.0/1.1 |
| 14 | | 450 | 0.9/1.0 |
| 15 | | 500 | 1.1/1.2 |
| 16 | | 550 | 1.0/1.1 |
| 17 | | 600 | 0.9/1.1 |
| 18 | | 650 | 1.0/1.0 |
| 19 | D | 400 | 1.1/1.0 |
| 20 | | 450 | 1.0/1.0 |
| 21 | | 500 | 1.2/1.1 |
| 22 | | 550 | 1.0/1.1 |
| 23 | | 600 | 1.1/1.0 |
| 24 | | 650 | 1.1/0.9 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)hd$ 4
D = $Ba(DPM)_2 + Sr(DPM)_2 + Ti(O\text{-}t\text{-}Bu)_2(DPM)_2$

Example 23

BST thin films (a thickness of about 20 nm) were formed on substrates by the MOCVD method in the same manner as Examples 1 to 4 except that the solvent was changed to 1-ethoxy-2-propanol. The results of measurement of the metal atomic ratio of each of the formed thin films were shown in Table 23 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 23

Example 23: Solvent = 1-ethoxy-2-propanol

| Test No. | Organo-metallic compound[1] | Substrate temperature (° C.) | Film composition Ba/Sr atomic ratio |
|---|---|---|---|
| 1 | A | 400 | 0.9/1.1 |
| 2 | | 450 | 1.0/0.9 |
| 3 | | 500 | 1.0/1.1 |
| 4 | | 550 | 1.0/1.0 |
| 5 | | 600 | 0.9/1.1 |
| 6 | | 650 | 1.0/1.0 |
| 7 | B | 400 | 1.0/1.1 |
| 8 | | 450 | 1.0/1.0 |
| 9 | | 500 | 1.1/1.1 |

TABLE 23-continued

Example 23: Solvent = 1-ethoxy-2-propanol

| Test No. | Organometallic compound[1] | Substrate temperature (° C.) | Film composition Ba/Sr atomic ratio |
|---|---|---|---|
| 10 | | 550 | 1.0/1.0 |
| 11 | | 600 | 1.1/1.0 |
| 12 | | 650 | 1.0/1.1 |
| 13 | C | 400 | 1.0/1.1 |
| 14 | | 450 | 1.2/1.2 |
| 15 | | 500 | 1.0/1.0 |
| 16 | | 550 | 1.1/1.0 |
| 17 | | 600 | 1.0/1.0 |
| 18 | | 650 | 1.2/1.1 |
| 19 | D | 400 | 1.1/1.1 |
| 20 | | 450 | 1.0/1.0 |
| 21 | | 500 | 1.1/1.1 |
| 22 | | 550 | 1.1/1.0 |
| 23 | | 600 | 1.0/1.0 |
| 24 | | 650 | 1.1/1.1 |

[1]Organometallic compound:
A = $Ba(DPM)_2 + Sr(DPM)_2 + Ti(O\text{-}i\text{-}Pr)_2\ (DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2\ (DPM)_2$

Example 24

BST thin films (a thickness of about 20 nm) were formed on substrates by the MOCVD method in the same manner as Examples 1 to 4 except that the solvent was changed to 1-butoxy-2-propanol. The results of measurement of the metal atomic ratio and the step coverage of each of the formed thin films were shown in Table 24 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results in comparative examples in which the solvent was changed to THF are as shown in Tables 1 to 4.

TABLE 24

Example 24: Solvent = 1-butoxy-2-propanol

| Test No. | Organometallic compound[1] | Substrate temperature (° C.) | Substrate composition Ba/Sr atomic ratio | Step coverage |
|---|---|---|---|---|
| 1 | A | 400 | 1.1/1.1 | 0.91 |
| 2 | | 450 | 1.1/1.0 | 0.92 |
| 3 | | 500 | 1.0/1.1 | 0.91 |
| 4 | | 550 | 1.1/1.2 | 0.90 |
| 5 | | 600 | 1.0/1.0 | 0.91 |
| 6 | | 650 | 1.1/1.1 | 0.93 |
| 7 | B | 400 | 0.8/1.0 | 0.91 |
| 8 | | 450 | 1.0/1.1 | 0.92 |
| 9 | | 500 | 0.9/1.1 | 0.92 |
| 10 | | 550 | 1.1/1.0 | 0.91 |
| 11 | | 600 | 1.0/1.0 | 0.91 |
| 12 | | 650 | 0.9/1.1 | 0.93 |
| 13 | C | 400 | 0.9/1.1 | 0.91 |
| 14 | | 450 | 1.0/1.0 | 0.92 |
| 15 | | 500 | 1.2/1.2 | 0.90 |
| 16 | | 550 | 1.1/1.1 | 0.91 |
| 17 | | 600 | 1.0/1.0 | 0.95 |
| 18 | | 650 | 1.2/1.0 | 0.95 |
| 19 | D | 400 | 1.2/1.1 | 0.95 |
| 20 | | 450 | 1.1/1.1 | 0.90 |
| 21 | | 500 | 0.9/1.0 | 0.91 |
| 22 | | 550 | 1.1/1.0 | 0.90 |
| 23 | | 600 | 1.0/1.0 | 0.91 |
| 24 | | 650 | 0.9/1.1 | 0.95 |

[1]Organometallic compound:
A = $Ba(DPM)_2 + Sr(DPM)_2 + Ti(O\text{-}i\text{-}Pr)_2\ (DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 25

BST thin films (a thickness of about 20 nm) were formed on substrates by the MOCVD method in the same manner as Examples 1 to 4 except that the solvent was changed to propylene glycol. The results of measurement of the metal atomic ratio and the step coverage of each of the formed thin films were shown in Table 25 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results in comparative examples in which the solvent was changed to THF are as shown in Tables 1 to 4.

TABLE 25

Example 25: Solvent = propylene glycol

| Test No. | Organometallic compound[1] | Substrate temperature (° C.) | Film composition Ba/Sr atomic ratio | Step coverage |
|---|---|---|---|---|
| 1 | A | 400 | 1.0/1.1 | 0.91 |
| 2 | | 450 | 1.0/1.1 | 0.92 |
| 3 | | 500 | 1.1/1.0 | 0.91 |
| 4 | | 550 | 1.0/1.0 | 0.93 |
| 5 | | 600 | 1.0/1.0 | 0.94 |
| 6 | | 650 | 1.1/1.1 | 0.92 |
| 7 | B | 400 | 0.9/1.1 | 0.92 |
| 8 | | 450 | 1.0/1.1 | 0.91 |
| 9 | | 500 | 0.9/1.1 | 0.93 |
| 10 | | 550 | 1.0/1.0 | 0.94 |
| 11 | | 600 | 1.0/1.0 | 0.93 |
| 12 | | 650 | 0.9/1.1 | 0.94 |
| 13 | C | 400 | 1.1/1.1 | 0.95 |
| 14 | | 450 | 1.0/0.9 | 0.94 |
| 15 | | 500 | 1.1/1.1 | 0.93 |
| 16 | | 550 | 1.0/0.9 | 0.93 |
| 17 | | 600 | 1.0/1.0 | 0.94 |
| 18 | | 650 | 1.1/1.1 | 0.95 |
| 19 | D | 400 | 1.0/1.1 | 0.95 |
| 20 | | 450 | 0.9/1.1 | 0.91 |
| 21 | | 500 | 0.9/1.0 | 0.93 |
| 22 | | 550 | 1.0/1.0 | 0.92 |
| 23 | | 600 | 1.1/1.0 | 0.91 |
| 24 | | 650 | 0.9/1.1 | 0.94 |

TABLE 25-continued

Example 25: Solvent = propylene glycol

| Test No. | Organo-metallic compound[1] | Substrate temperature (° C.) | Film composition Ba/Sr atomic ratio | Step coverage |
|---|---|---|---|---|

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 26

BST thin films (a thickness of about 20 nm) were formed on substrates by the MOCVD method in the same manner as Examples 1 to 4 except that the solvent was changed to 2,5-dimethyltetrahydrofuran. The results of two times of measurement of the metal atomic ratio and the step coverage of each of the formed thin films at each temperature were shown in Table 26 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results in comparative examples in which the solvent was changed to THF are as shown in Tables 1 to 4.

TABLE 26

Example 26: Solvent = 2,5-dimethyltetrahydrofuran

| Test No. | Organo-metallic compound[1] | Substrate temperature (° C.) | Film composition Ba/Sr atomic ratio | Step coverage |
|---|---|---|---|---|
| 1 | A | 400 | 1.0/1.1 | 0.98 |
| 2 | | 450 | 1.0/0.9 | 0.99 |
| 3 | | 500 | 1.0/1.1 | 0.97 |
| 4 | | 550 | 1.1/1.0 | 1.00 |
| 5 | | 600 | 0.9/1.0 | 1.00 |
| 6 | | 650 | 1.0/1.1 | 0.98 |
| 7 | | 400 | 1.0/1.1 | 0.97 |
| 8 | | 450 | 1.0/1.0 | 0.97 |
| 9 | | 500 | 1.1/1.0 | 1.00 |
| 10 | | 550 | 1.0/1.1 | 0.98 |
| 11 | | 600 | 1.1/1.1 | 1.00 |
| 12 | | 650 | 1.0/1.0 | 1.00 |
| 13 | B | 400 | 1.0/0.9 | 0.97 |
| 14 | | 450 | 1.0/1.1 | 0.99 |
| 15 | | 500 | 1.0/1.0 | 0.98 |
| 16 | | 550 | 1.0/1.1 | 1.00 |
| 17 | | 600 | 1.1/1.0 | 1.00 |
| 18 | | 650 | 1.0/1.1 | 0.98 |
| 19 | | 400 | 1.0/1.0 | 0.97 |
| 20 | | 450 | 1.0/1.0 | 0.99 |
| 21 | | 500 | 1.0/1.1 | 1.00 |
| 22 | | 550 | 0.8/0.8 | 0.98 |
| 23 | | 600 | 1.0/1.0 | 1.00 |
| 24 | | 650 | 1.0/1.0 | 1.00 |
| 25 | C | 400 | 1.0/1.1 | — |
| 26 | | 450 | 0.9/1.0 | — |
| 27 | | 500 | 1.1/1.0 | — |
| 28 | | 550 | 1.1/1.0 | — |
| 29 | | 600 | 1.0/1.0 | — |
| 30 | | 650 | 1.2/1.1 | — |
| 31 | | 400 | 1.0/1.0 | — |
| 32 | | 450 | 0.9/1.0 | — |
| 33 | | 500 | 1.1/1.2 | — |

TABLE 26-continued

Example 26: Solvent = 2,5-dimethyltetrahydrofuran

| Test No. | Organo-metallic compound[1] | Substrate temperature (° C.) | Film composition Ba/Sr atomic ratio | Step coverage |
|---|---|---|---|---|
| 34 | | 550 | 1.0/1.1 | — |
| 35 | | 600 | 0.9/1.0 | — |
| 36 | | 650 | 1.0/1.0 | — |
| 37 | D | 400 | 1.0/1.1 | 0.98 |
| 38 | | 450 | 1.0/1.1 | 0.97 |
| 39 | | 500 | 0.9/1.0 | 0.98 |
| 40 | | 550 | 1.0/1.2 | 1.00 |
| 41 | | 600 | 1.0/1.0 | 0.99 |
| 42 | | 650 | 1.2/1.1 | 0.99 |
| 43 | | 400 | 1.0/1.1 | 1.00 |
| 44 | | 450 | 1.0/1.0 | 0.98 |
| 45 | | 500 | 1.1/1.0 | 0.99 |
| 46 | | 550 | 1.2/1.1 | 0.98 |
| 47 | | 600 | 1.0/1.0 | 0.98 |
| 48 | | 650 | 0.9/1.0 | 1.00 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 27

BST thin films (a thickness of about 20 nm) were formed on substrates by the MOCVD method in the same manner as Examples 1 to 4 except that the solvent was changed to 2-methyltetrahydrofuran. The results of two times of measurement of the metal atomic ratio and the step coverage of each of the formed thin films at each temperature were shown in Table 27 together with the substrate temperatures. This table indicates that since the film composition hardly changes with changes in the substrate temperature, dielectric thin films having a substantially constant composition can be formed, and the controllability of the film composition Is thus excellent. The step coverage is also good. In this example, the results in comparative examples in which the solvent was changed to THF are as shown in Tables 1 to 4. When the solvent was changed to 3-methyltetrahydrofuran, substantially the same results those shown in Table 27 were obtained.

TABLE 27

Example 27: Solvent = 2-methyltetrahydrofuran

| Test No. | Organo-metallic compound[1] | Substrate temperature (° C.) | Film composition Ba/Sr atomic ratio | Step coverage |
|---|---|---|---|---|
| 1 | A | 400 | 1.0/1.1 | 1.00 |
| 2 | | 450 | 1.0/0.9 | 0.95 |
| 3 | | 500 | 1.0/1.1 | 0.96 |
| 4 | | 550 | 1.1/1.0 | 1.00 |
| 5 | | 600 | 0.9/1.0 | 0.98 |
| 6 | | 650 | 1.0/1.1 | 0.98 |
| 7 | | 400 | 1.0/1.1 | 0.98 |
| 8 | | 450 | 1.0/1.0 | 0.95 |
| 9 | | 500 | 1.0/1.0 | 0.99 |
| 10 | | 550 | 1.0/1.1 | 0.98 |
| 11 | | 600 | 0.9/0.9 | 1.0 |
| 12 | | 650 | 1.0/0.9 | 1.0 |
| 13 | B | 400 | 1.0/1.0 | 1.00 |

TABLE 27-continued

Example 27: Solvent = 2-methyltetrahydrofuran

| Test No. | Organo-metallic compound[1] | Substrate temperature (° C.) | Film composition Ba/Sr atomic ratio | Step coverage |
|---|---|---|---|---|
| 14 | | 450 | 1.1/1.1 | 1.00 |
| 15 | | 500 | 1.0/1.0 | 0.98 |
| 16 | | 550 | 1.2/1.1 | 0.95 |
| 17 | | 600 | 1.1/1.0 | 0.97 |
| 18 | | 650 | 1.0/1.0 | 0.98 |
| 19 | | 400 | 1.1/1.0 | 0.98 |
| 20 | | 450 | 1.0/1.0 | 0.98 |
| 21 | | 500 | 1.0/1.1 | 0.97 |
| 22 | | 550 | 0.9/0.9 | 0.98 |
| 23 | | 600 | 1.0/1.0 | 0.98 |
| 24 | | 650 | 0.9/0.9 | 0.98 |
| 25 | C | 400 | 1.0/1.0 | — |
| 26 | | 450 | 0.9/1.0 | — |
| 27 | | 500 | 1.1/1.1 | — |
| 28 | | 550 | 1.1/1.0 | — |
| 29 | | 600 | 1.0/1.0 | — |
| 30 | | 650 | 1.0/1.1 | — |
| 31 | | 400 | 1.0/1.0 | — |
| 32 | | 450 | 0.9/1.0 | — |
| 33 | | 500 | 1.1/1.0 | — |
| 34 | | 550 | 1.0/1.1 | — |
| 35 | | 600 | 1.1/1.0 | — |
| 36 | | 650 | 1.0/1.0 | — |
| 37 | D | 400 | 1.1/1.1 | 0.98 |
| 38 | | 450 | 1.0/1.0 | 0.97 |
| 39 | | 500 | 1.2/1.0 | 1.00 |
| 40 | | 550 | 1.0/1.2 | 0.98 |
| 41 | | 600 | 1.0/1.0 | 0.98 |
| 42 | | 650 | 1.2/1.2 | 0.97 |
| 43 | | 400 | 1.0/1.1 | 1.00 |
| 44 | | 450 | 1.0/1.0 | 0.98 |
| 45 | | 500 | 1.1/1.0 | 0.96 |
| 46 | | 550 | 1.0/1.1 | 0.95 |
| 47 | | 600 | 1.0/1.0 | 1.00 |
| 48 | | 650 | 1.1/1.0 | 0.98 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 28

BST thin films (a thickness of about 20 nm) were formed on substrates by the MOCVD method in the same manner as Examples 1 to 4 except that the solvent was changed to diisobutyl ether. The results of two times of measurement of the metal atomic ratio and the step coverage of each of the formed thin films at each temperature were shown in Table 26 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results in comparative examples in which the solvent was changed to THF are as shown in Tables 1 to 4.

TABLE 28

Example 28: Solvent = diisobutyl ether

| Test No. | Organo-metallic compound[1] | Substrate temperature (° C.) | Film composition Ba/Sr atomic ratio | Step coverage |
|---|---|---|---|---|
| 1 | A | 400 | 1.0/1.1 | 0.90 |
| 2 | | 450 | 1.0/0.9 | 0.91 |
| 3 | | 500 | 1.0/1.1 | 0.92 |
| 4 | | 550 | 1.1/1.0 | 0.91 |
| 5 | | 600 | 0.8/1.0 | 0.93 |
| 6 | | 650 | 0.9/1.0 | 0.90 |
| 7 | | 400 | 1.0/1.0 | 0.90 |
| 8 | | 450 | 1.0/1.0 | 0.95 |
| 9 | | 500 | 1.1/1.0 | 0.92 |
| 10 | | 550 | 0.9/0.8 | 0.96 |
| 11 | | 600 | 0.9/1.1 | 1.0 |
| 12 | | 650 | 1.0/1.0 | 1.0 |
| 13 | B | 400 | 1.0/1.0 | 0.90 |
| 14 | | 450 | 1.1/1.1 | 0.91 |
| 15 | | 500 | 1.0/1.0 | 0.93 |
| 16 | | 550 | 1.2/1.1 | 0.90 |
| 17 | | 600 | 1.1/1.0 | 0.93 |
| 18 | | 650 | 1.0/1.1 | 0.95 |
| 19 | | 400 | 1.1/1.1 | 0.98 |
| 20 | | 450 | 1.0/1.0 | 0.91 |
| 21 | | 500 | 1.0/1.0 | 0.93 |
| 22 | | 550 | 0.8/0.9 | 0.95 |
| 23 | | 600 | 1.0/1.0 | 0.94 |
| 24 | | 650 | 0.9/1.0 | 0.98 |
| 25 | C | 400 | 1.0/0.9 | — |
| 26 | | 450 | 0.9/1.0 | — |
| 27 | | 500 | 1.1/1.1 | — |
| 28 | | 550 | 1.1/1.0 | — |
| 29 | | 600 | 1.0/1.0 | — |
| 30 | | 650 | 1.0/1.1 | — |
| 31 | | 400 | 1.0/1.0 | — |
| 32 | | 450 | 0.8/1.0 | — |
| 33 | | 500 | 1.2/1.2 | — |
| 34 | | 550 | 1.0/1.1 | — |
| 35 | | 600 | 1.1/1.1 | — |
| 36 | | 650 | 1.0/1.0 | — |
| 37 | D | 400 | 1.1/1.0 | 0.90 |
| 38 | | 450 | 1.0/1.1 | 0.95 |
| 39 | | 500 | 1.2/1.0 | 0.96 |
| 40 | | 550 | 1.0/1.2 | 0.95 |
| 41 | | 600 | 1.0/1.0 | 0.93 |
| 42 | | 650 | 1.2/1.2 | 0.92 |
| 43 | | 400 | 1.0/1.1 | 0.90 |
| 44 | | 450 | 1.0/1.0 | 0.90 |
| 45 | | 500 | 1.1/1.0 | 0.95 |
| 46 | | 550 | 1.2/1.1 | 0.95 |
| 47 | | 600 | 1.1/1.0 | 0.97 |
| 48 | | 650 | 1.1/1.0 | 0.98 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 29

BST thin films (a thickness of about 20 nm) were formed on substrates by the MOCVD method in the same manner as Example 8 except that the solvent was changed to 2,5-dimethyltetrahydrofuran, 2-methyltetrahydrofuran, dioxane, diisobutyl ether, and a solvent mixture of 2,5-dimethyltetrahydrofuran and 2-methyltetrahydrofuran. The results of measurement of the metal atomic ratio and the step coverage of each of the formed thin films were shown in Table 29 together with the substrate temperatures. This table indicates that since the film composition hardly changes with changes in the substrate temperature, dielectric thin films having a substantially constant composition can be formed, and the controllability of the film composition is thus excellent. The step coverage is also good. In this example, the results of the film compositions in comparative examples in which the solvent was changed to THF are as shown in Table 8.

TABLE 29

| Test No. | Solution raw material for MOCVD: Organo-metallic compound | Solvent | Substrate temperature (° C.) | Film composition: Ba/Sr atomic ratio | Step coverage |
|---|---|---|---|---|---|
| 1 | $Ba(DPM_2$ · | 2,5- | 400 | 0.9/1.1 | 0.98 |
| 2 | TEG + | dimethyl | 450 | 1.0/1.1 | 0.95 |
| 3 | $Sr(DPM_2$ · | tetra- | 500 | 1.0/1.1 | 0.92 |
| 4 | TEG + | hydro- | 550 | 1.0/1.0 | 0.98 |
| 5 | $Ti(O-t-Bu)_2$ | furan | 600 | 1.0/1.0 | 1.00 |
| 6 | $(DPM)_2$ | | 650 | 1.0/1.1 | 1.00 |
| 7 | | 2-methyl | 400 | 1.1/1.1 | 0.97 |
| 8 | | tetra- | 450 | 1.1/1.0 | 1.00 |
| 9 | | hydro- | 500 | 1.0/1.0 | 0.98 |
| 10 | | furan | 550 | 0.9/1.0 | 1.00 |
| 11 | | | 600 | 0.9/1.1 | 0.98 |
| 12 | | | 650 | 1.0/1.0 | 1.00 |
| 13 | | Dioxane | 400 | 1.1/1.1 | 0.90 |
| 14 | | | 450 | 1.1/1.0 | 0.93 |
| 15 | | | 500 | 1.0/1.1 | 0.92 |
| 16 | | | 550 | 0.9/1.0 | 0.90 |
| 17 | | | 600 | 1.0/1.1 | 0.92 |
| 18 | | | 650 | 1.0/1.0 | 0.91 |
| 19 | | Isobutyl | 400 | 1.0/1.0 | 0.90 |
| 20 | | ether | 450 | 0.8/0.9 | 0.91 |
| 21 | | | 500 | 1.0/1.1 | 0.94 |
| 22 | | | 550 | 1.0/1.1 | 0.92 |
| 23 | | | 600 | 1.1/1.0 | 0.96 |
| 24 | | | 650 | 1.0/1.0 | 0.95 |
| 25 | | 2,5- | 400 | 1.0/1.1 | 0.98 |
| 26 | | dimethyl | 450 | 1.1/1.1 | 1.00 |
| 27 | | tetra- | 500 | 1.0/1.0 | 0.99 |
| 28 | | hydro- | 550 | 1.0/1.1 | 1.00 |
| 29 | | furan/ | 600 | 0.9/1.0 | 0.98 |
| 30 | | tetra- hydro- furan 1:1 solvent mixture | 650 | 1.0/1.1 | 1.00 |

Example 30

BST thin films (a thickness of about 20 nm) were formed on substrates by the MOCVD method in the same manner as Example 8 except that the solvent was changed to 3-methyltetrahydrofuran, methyl acetoacetate or ethyl acetoacetate. The results of measurement of the metal atomic ratio of each of the formed thin films were shown in Table 30 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Table 8.

TABLE 30

Example 30: Raw material compounds = $Ba(DPM)_2$ · TEG + $Sr(DPM)_2$ · TEG + $Ti(O-tBu)_2(DPM)_2$

| Test No. | Solvent | Substrate temperature (° C.) | Film composition Ba/Sr atomic ratio |
|---|---|---|---|
| 1 | 3- | 400 | 1.0/1.0 |
| 2 | methyl | 450 | 1.0/1.1 |
| 3 | tetra- | 500 | 1.2/1.2 |
| 4 | hydro- | 550 | 1.0/1.0 |
| 5 | furan | 600 | 1.0/1.0 |
| 6 | | 650 | 1.0/1.0 |
| 7 | Methyl | 400 | 1.0/1.0 |
| 8 | aceto- | 450 | 1.1/1.1 |
| 9 | acetate | 500 | 1.1/1.1 |
| 10 | | 550 | 1.0/1.1 |
| 11 | | 600 | 1.0/1.0 |
| 12 | | 650 | 1.1/1.0 |
| 13 | Ethyl | 400 | 0.9/1.0 |
| 14 | aceto- | 450 | 1.1/1.1 |
| 15 | acetate | 500 | 1.1/1.2 |
| 16 | | 550 | 1.0/1.0 |
| 17 | | 600 | 1.0/1.1 |
| 18 | | 650 | 1.1/1.1 |

Example 31

BST thin films (a thickness of about 20 nm) were formed on substrates by the MOCVD method in the same manner as Examples 1 to 4 except that the solvent was changed to a solvent mixture of n-hexane and 2,5-dimethyltetrahydrofuran at a weight ratio of 1:1. The results of measurement of the metal atomic ratio of each of the formed thin films were shown in Table 31 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 31

Example 31: Solvent = n-hexane + 2,5-dimethyltetrahydrofuran (1:1)

| Test No. | Organo-metal-lic com-pound[1] | Sub-strate temper-ature (° C.) | Film compo-sition Ba/Sr atomic ratio | Test No. | Organo-metal-lic com-pound[1] | Sub-strate temper-ature (° C.) | Film composi-tion Ba/Sr atomic ratio |
|---|---|---|---|---|---|---|---|
| 1 | A | 400 | 1.0/1.0 | 13 | C | 400 | 0.9/0.9 |
| 2 | | 450 | 0.9/0.9 | 14 | | 450 | 1.0/1.0 |
| 3 | | 500 | 1.0/1.0 | 15 | | 500 | 1.0/1.0 |
| 4 | | 550 | 0.9/0.9 | 16 | | 550 | 1.1/1.0 |
| 5 | | 600 | 1.0/1.0 | 17 | | 600 | 1.0/1.0 |
| 6 | | 650 | 1.0/1.0 | 18 | | 650 | 1.0/1.0 |
| 7 | B | 400 | 0.9/1.0 | 19 | D | 400 | 1.0/1.0 |
| 8 | | 450 | 1.0/1.0 | 20 | | 450 | 1.1/1.1 |
| 9 | | 500 | 1.0/1.0 | 21 | | 500 | 1.1/1.1 |
| 10 | | 550 | 1.0/1.0 | 22 | | 550 | 1.0/1.0 |
| 11 | | 600 | 1.0/1.1 | 23 | | 600 | 1.0/1.1 |
| 12 | | 650 | 1.0/1.0 | 24 | | 650 | 1.0/1.0 |

[1]Organometallic compound:
A = $Ba(DPM)_2 + Sr(DPM)_2 + Ti(O-i-Pr)_2(DPM)_2$
B = $Ba(DPM)_2 + Sr(DPM)_2 + TiO(DPM)_2$ TABLE 31-continued Example 31: Solvent = n-hexane + 2,5-dimethyltetrahydrofuran (1:1)

| Test No. | Organo-metal-lic com-pound[1] | Sub-strate temper-ature (° C.) | Film compo-sition Ba/Sr atomic ratio | Test No. | Organo-metal-lic com-pound[1] | Sub-strate temper-ature (° C.) | Film composi-tion Ba/Sr atomic ratio |
|---|---|---|---|---|---|---|---|

C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 32

BST thin films (a thickness of about 20 nm) were formed on substrates by the MOCVD method in the same manner as Examples 1 to 4 except that the solvent was changed to a solvent mixture of n-hexane and 2-methyltetrahydrofuran at a weight ratio of 1:1. The results of measurement of the metal atomic ratio of each of the formed thin films were shown in Table 32 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4. When 3-methyltetrahydrofuran was used in place of 2-methyltetrahydrofruan, substantially the same results as shown in Table 32 were obtained.

TABLE 32

Example 32: Solvent = n-hexane + 2-methyltetrahydrofuran (1:1)

| Test No. | Organo-metal-lic com-pound[1] | Sub-strate temper-ature (° C.) | Film compo-sition Ba/Sr atomic ratio | Test No. | Organo-metal-lic com-pound[1] | Sub-strate temper-ature (° C.) | Film composi-tion Ba/Sr atomic ratio |
|---|---|---|---|---|---|---|---|
| 1 | A | 400 | 1.0/1.0 | 13 | C | 400 | 1.0/0.9 |
| 2 | | 450 | 1.0/1.0 | 14 | | 450 | 1.0/1.1 |
| 3 | | 500 | 1.1/1.1 | 15 | | 500 | 1.0/1.0 |
| 4 | | 550 | 1.0/1.0 | 16 | | 550 | 0.9/1.0 |
| 5 | | 600 | 1.0/1.1 | 17 | | 600 | 1.1/1.0 |
| 6 | | 650 | 1.0/1.0 | 18 | | 650 | 1.0/1.0 |
| 7 | B | 400 | 0.8/1.0 | 19 | D | 400 | 1.0/1.0 |
| 8 | | 450 | 1.0/1.0 | 20 | | 450 | 1.1/1.1 |
| 9 | | 500 | 1.0/0.9 | 21 | | 500 | 1.0/1.0 |
| 10 | | 550 | 0.9/0.9 | 22 | | 550 | 1.0/1.0 |
| 11 | | 600 | 1.0/1.0 | 23 | | 600 | 1.0/1.1 |
| 12 | | 650 | 1.0/0.9 | 24 | | 650 | 1.0/0.9 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}BU)_2(DPM)_2$

Example 33

BST thin films (a thickness of about 20 nm) were formed on substrates by the MOCVD method in the same manner as Examples 1 to 4 except that the solvent was changed to a solvent mixture of n-hexane and diisobutyl ether at a weight ratio of 1:1. The results of measurement of the metal atomic ratio of each of the formed thin films were shown in Table 33 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown In Tables 1 to 4.

TABLE 33

Example 33: Solvent = n-hexane + diisobutyl ether (1:1)

| Test No. | Organo-metal-lic com-pound[1] | Sub-strate temper-ature (° C.) | Film compo-sition Ba/Sr atomic ratio | Test No. | Organo-metal-lic com-pound[1] | Sub-strate temper-ature (° C.) | Film composi-tion Ba/Sr atomic ratio |
|---|---|---|---|---|---|---|---|
| 1 | A | 400 | 1.0/1.0 | 13 | C | 400 | 1.1/1.1 |
| 2 | | 450 | 0.9/1.0 | 14 | | 450 | 1.0/1.0 |
| 3 | | 500 | 1.1/1.1 | 15 | | 500 | 1.0/1.0 |
| 4 | | 550 | 1.0/1.0 | 16 | | 550 | 1.1/1.0 |
| 5 | | 600 | 1.0/1.0 | 17 | | 600 | 1.1/1.0 |
| 6 | | 650 | 1.0/1.0 | 18 | | 650 | 1.0/1.0 |
| 7 | B | 400 | 0.9/1.0 | 19 | D | 400 | 1.0/1.0 |
| 8 | | 450 | 1.0/1.0 | 20 | | 450 | 0.9/0.9 |
| 9 | | 500 | 1.1/1.0 | 21 | | 500 | 1.1/1.1 |
| 10 | | 550 | 1.0/1.0 | 22 | | 550 | 1.0/1.0 |
| 11 | | 600 | 1.0/0.9 | 23 | | 600 | 1.0/1.1 |
| 12 | | 650 | 1.0/1.0 | 24 | | 650 | 1.0/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 34

BST thin films (a thickness of about 20 nm) were formed on substrates by the MOCVD method in the same manner as Examples 1 to 4 except that the solvent was changed to a solvent mixture of n-hexane and dioxane at a weight ratio of 1:1. The results of measurement of the metal atomic ratio of each of the formed thin films were shown in Table 34 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4.

TABLE 34

Example 34: Solvent = n-hexane + dioxane (1:1)

| Test No. | Organo-metal-lic com-pound[1] | Sub-strate temper-ature (° C.) | Film compo-sition Ba/Sr atomic ratio | Test No. | Organo-metal-lic com-pound[1] | Sub-strate temper-ature (° C.) | Film composi-tion Ba/Sr atomic ratio |
|---|---|---|---|---|---|---|---|
| 1 | A | 400 | 0.9/0.9 | 13 | C | 400 | 1.0/1.0 |
| 2 | | 450 | 1.0/1.0 | 14 | | 450 | 1.0/1.1 |
| 3 | | 500 | 1.0/1.1 | 15 | | 500 | 1.0/1.0 |
| 4 | | 550 | 1.0/0.9 | 16 | | 550 | 1.0/1.0 |
| 5 | | 600 | 1.0/1.1 | 17 | | 600 | 1.1/1.0 |
| 6 | | 650 | 1.0/1.0 | 18 | | 650 | 1.0/1.0 |
| 7 | B | 400 | 1.0/1.0 | 19 | D | 400 | 1.0/1.0 |
| 8 | | 450 | 1.0/1.0 | 20 | | 450 | 1.1/1.0 |
| 9 | | 500 | 1.0/1.0 | 21 | | 500 | 1.0/1.1 |
| 10 | | 550 | 1.1/1.0 | 22 | | 550 | 1.0/1.0 |

TABLE 34-continued

Example 34: Solvent = n-hexane + dioxane (1:1)

| Test No. | Organometallic compound[1] | Substrate temperature (° C.) | Film composition Ba/Sr atomic ratio | Test No. | Organometallic compound[1] | Substrate temperature (° C.) | Film composition Ba/Sr atomic ratio |
|---|---|---|---|---|---|---|---|
| 11 | | 600 | 1.0/0.9 | 23 | | 600 | 1.0/1.0 |
| 12 | | 650 | 1.0/1.0 | 24 | | 650 | 1.0/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 35

BST thin films (a thickness of about 20 nm) were formed on substrates by the MOCVD method in the same manner as Examples 1 to 4 except that the solvent was changed to a solvent mixture of 2,5-dimethyl tetrahydrofuran and 2-methyl tetrahydrofuran at a weight ratio of 1:1. The results of measurement of the metal atomic ratio of each of the formed thin films were shown in Table 35 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Tables 1 to 4. When 3-methyl tetrahydrofuran was used in place of 2-methyl tetrahydrofuran, substantially the same results as shown in Table 35 were obtained.

TABLE 35

Example 35: Solvent = 2,5-dimethyl tetrahydrofuran + 2-methyl tetrahydrofuran (1:1)

| Test No. | Organometallic compound[1] | Substrate temperature (° C.) | Film composition Ba/Sr atomic ratio | Test No. | Organometallic compound[1] | Substrate temperature (° C.) | Film composition Ba/Sr atomic ratio |
|---|---|---|---|---|---|---|---|
| 1 | A | 400 | 0.9/1.0 | 13 | C | 400 | 1.1/1.1 |
| 2 | | 450 | 1.0/1.0 | 14 | | 450 | 1.0/1.1 |
| 3 | | 500 | 1.0/1.1 | 15 | | 500 | 1.0/0.9 |
| 4 | | 500 | 1.0/1.0 | 16 | | 550 | 1.0/1.0 |
| 5 | | 600 | 1.0/1.1 | 17 | | 600 | 1.0/1.0 |
| 6 | | 650 | 1.0/0.9 | 18 | | 650 | 1.0/1.0 |
| 7 | B | 400 | 1.0/1.0 | 19 | D | 400 | 0.9/1.0 |
| 8 | | 450 | 1.0/1.0 | 20 | | 450 | 1.1/1.1 |
| 9 | | 500 | 1.0/1.0 | 21 | | 500 | 1.0/1.0 |
| 10 | | 550 | 1.0/1.0 | 22 | | 550 | 1.0/1.0 |
| 11 | | 600 | 1.0/1.1 | 23 | | 600 | 1.0/1.0 |
| 12 | | 650 | 1.0/1.0 | 24 | | 650 | 1.0/1.0 |

[1]Organometallic compound:
A = $Ba(DPM)_2 + Sr(DPM)_2 + Ti(O\text{-}i\text{-}Pr)_2(DPM)_2$
B = $Ba(DPM)_2 + Sr(DPM)_2 + TiO(DPM)_2$
C = $Ba(DPM)_2 + Sr(DPM)_2 + Ti(O\text{-}i\text{-}Pr)_4$
D = $Ba(DPM)_2 + Sr(DPM)_2 + Ti(O\text{-}t\text{-}Bu)_2(DPM)_2$

Example 36

BST thin films (a thickness of about 20 nm) were formed on substrates by the MOCVD method in the same manner as Example 4 except that the solvent was changed to each of the ester solvents shown in Table 36. The results of measurement of the metal atomic ratio of each of the formed thin films were shown in Table 36 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Table 4.

TABLE 36

Example 36: Raw material compounds = $Ba(DPM)_2 + Sr(DPM)_2 + Ti(O\text{-}tBu)_2(DPM)_2$

| Test No. | Solvent | Substrate temperature (° C.) | Film composition Ba/Sr atomic ratio | Test No. | Solvent | Substrate temperature (° C.) | Film composition Ba/Sr atomic ratio |
|---|---|---|---|---|---|---|---|
| 1 | Methyl | 400 | 1.0/1.0 | 13 | Ethyl | 400 | 1.1/1.0 |
| 2 | aceto- | 450 | 1.0/1.1 | 14 | aceto- | 450 | 1.0/1.1 |
| 3 | acetate | 500 | 1.2/1.1 | 15 | acetate | 500 | 1.2/1.1 |
| 4 | | 550 | 1.0/1.1 | 16 | | 550 | 1.1/1.0 |
| 5 | | 600 | 0.9/1.0 | 17 | | 600 | 0.9/1.0 |
| 6 | | 650 | 1.1/1.1 | 18 | | 650 | 1.2/1.1 |

Example 37

BST thin films (a thickness of about 20 nm) were formed on substrates by the MOCVD method in the same manner as Example 1 except that the solvent was changed to each of the acetoacetic ester solvents shown in Table 37. The results of measurement of the metal atomic ratio of each of the formed thin films were shown in Table 37 together with the substrate temperatures. This table indicates that since the film composition hardly changes with changes in the substrate temperature, dielectric thin films having a substantially constant composition can be formed, and the controllability of the film composition is thus excellent. In this example, the results in comparative examples in which the solvent was changed to THF are as shown in Table 1.

TABLE 37

Example 37: Raw material compounds = $Ba(DPM)_2 + Sr(DPM)_2 + Ti(O\text{-}i\text{-}Pr)_2(DPM)_2$

| Test No. | Solvent | Substrate temperature (° C.) | Film composition Ba/Sr atomic ratio | Test No. | Solvent | Substrate temperature (° C.) | Film composition Ba/Sr atomic ratio |
|---|---|---|---|---|---|---|---|
| 1 | Methyl | 400 | 1.0/1.1 | 13 | Ethyl | 400 | 1.1/1.1 |
| 2 | aceto- | 450 | 1.0/1.0 | 14 | aceto- | 450 | 1.0/1.0 |
| 3 | acetate | 500 | 1.0/1.0 | 15 | acetate | 500 | 1.0/1.0 |
| 4 | | 550 | 1.1/1.0 | 16 | | 550 | 1.1/1.1 |
| 5 | | 600 | 1.0/1.0 | 17 | | 600 | 1.1/1.0 |
| 6 | | 650 | 1.0/0.9 | 18 | | 650 | 1.1/1.1 |

Example 38

BST thin films (a thickness of about 20 nm) were formed on substrates by the MOCVD method in the same manner as Example 1 except that the Ba and Sr raw material compounds were changed to $Ba(DPM)_2$.TEG and $Sr(DPM)_2$.TEG, respectively, and the solvent was changed to each of the acetoacetic ester solvents shown in Table 38. The results of measurement of the metal atomic ratio of each of the formed thin films were shown in Table 38 together with the substrate temperatures. This table indicates that since the film composition hardly changes with changes in the substrate temperature, dielectric thin films having a substantially constant composition can be formed, and the controllability of the film composition is thus excellent.

TABLE 38

Example 38: Raw material compounds = $Ba(DPM)_2$ .TEG + $Sr(DPM)_2$ .TEG + $Ti(O\text{-}iPr)_2(DPM)_2$

| Test No. | Solvent | Substrate temperature (° C.) | Film composition Ba/Sr atomic ratio | Test No. | Solvent | Substrate temperature (° C.) | Film composition Ba/Sr atomic ratio |
|---|---|---|---|---|---|---|---|
| 1 | Methyl | 400 | 1.0/1.1 | 13 | Ethyl | 400 | 1.1/0.9 |
| 2 | aceto- | 450 | 1.0/1.1 | 14 | aceto- | 450 | 1.0/1.0 |
| 3 | acetate | 500 | 0.9/1.0 | 15 | acetate | 500 | 1.0/1.0 |
| 4 | | 550 | 1.1/1.0 | 16 | | 550 | 1.1/1.0 |
| 5 | | 600 | 1.0/1.0 | 17 | | 600 | 1.1/1.0 |
| 6 | | 650 | 1.0/1.0 | 18 | | 650 | 1.1/1.1 |

Obviously, numerous modifications and variations of the present invention are possible in light of the above teachings. It is therefore to be understood that within the scope of the appended claims, the invention may be practiced otherwise than as specifically described herein.

What is claimed is:

1. A solution suitable for forming a composite oxide dielectric thin film, comprising at least one organometallic compound dissolved in a solvent mixture comprising at least one solvent selected from the group consisting of cyclic and acyclic saturated hydrocarbons, and at least one solvent selected from the group consisting of cyclic diethers, alkyl-substituted cyclic monoethers, mono- or di-branched alkyl monoethers, acetoacetic esters, and unsubstituted or alkyl-substituted pyridine, wherein the at least one organometallic compound includes a compound in which a metal atom combines with an organic group through an oxygen atom.

2. The solution of claim 1, wherein the at least one organometallic compound is selected from the group consisting of metal alkoxides, metal β-diketonato complexes, and metal alkoxide/β-diketonato complexes.

3. The solution of claim 2, wherein the alkoxides are isopropoxide or tert-butoxide, and the β-diketonato complexes are dipivaloylmethanato complexes.

4. The solution of claim 1, wherein the cyclic and acyclic saturated hydrocarbons are selected from the group consisting of alkanes and cycloalkanes having 5 to 8 carbon atoms, the cyclic diethers are selected from the group consisting of dioxane, the alkyl-substituted cyclic monoethers are selected from the group consisting of mono- or dimethyl-substituted tetrahydrofurans, the mono- or di-branched alkyl monoethers are selected from the group consisting of diisobutyl ether, diisopropyl ether, isobutyl lower alkyl ethers, and isopentyl lower alkyl ethers, and the acetoacetic esters are selected from the group consisting of lower alkyl alkyl esters of acetoacetic acid.

5. The solution of claim 3, wherein the at least one organometallic compound comprises dipivaloylmethanato complexes of barium and strontium, and a titanium compound selected from the group consisting of titanium isopropoxide, titanium tert-butoxide, titanium dipivaloylmethanato complex, titanium isopropoxide/dipivaloylmethanato complex, and titanium tert-butoxide/dipivaloylmethanato complex.

6. A solution suitable for forming a composite oxide dielectric thin film, comprising at least one organometallic compound dissolved in a solvent mixture comprising at least one solvent selected from the group consisting of cyclic and acyclic saturated hydrocarbons, and at least one solvent selected from the group consisting of alkyl-substituted cyclic monoethers, mono- or di-branched alkyl monoethers, and acetoacetic esters.

7. A method of depositing a composite oxide dielectric thin film on a substrate, comprising:

pyrolyzing a vapor of the solution of claim 1 on a substrate.

8. The method of claim 7, wherein at least two organometallic compounds are used.

9. The method of claim 8, wherein the pyrolyzing step is conducted in a deposition chamber.

10. The method of claim 9, wherein the vapor is transferred from a vaporization chamber to the deposition chamber.

11. The method of claim 10, wherein the solution is supplied in a liquid state to the vaporization chamber.

12. The method of claim 10, wherein a solution of each metal to be deposited is supplied to the vaporization chamber.

* * * * *